United States Patent [19]
Tamura et al.

[11] Patent Number: 5,707,875
[45] Date of Patent: Jan. 13, 1998

[54] 17O-LABELED PHOSPHORIC ACID COMPOUND AND METHOD AND APPARATUS FOR SELECTIVE OBSERVATION OF NUCLEAR MAGNETIC RESONANCE SIGNALS USING THE COMPOUND

[75] Inventors: Mitsuru Tamura, Kawagoe; Yoshinori Harada, Saitama-ken; Norio Shimizu, Sayama; Kenji Yasuda, Saitama-ken, all of Japan

[73] Assignee: Hitachi, Ltd., Tokyo, Japan

[21] Appl. No.: 513,510

[22] Filed: Aug. 10, 1995

[30] Foreign Application Priority Data

Aug. 11, 1994 [JP] Japan .................. 6-189235
Mar. 29, 1995 [JP] Japan .................. 7-071137

[51] Int. Cl.$^6$ .................. G01N 24/08; G01N 33/00; G01V 3/00
[52] U.S. Cl. .................. 436/173; 436/56; 436/103; 436/105; 128/653.2; 324/300; 324/307; 324/309; 324/322
[58] Field of Search .................. 424/1.11, 1.61, 424/1.65, 9.1, 9.3, 9.35; 324/300, 309, 307, 322; 436/103, 105, 56, 173; 128/653.2, 653.4, 653.5

[56] References Cited

U.S. PATENT DOCUMENTS

| | | | |
|---|---|---|---|
| 4,567,440 | 1/1986 | Haselgrove | 324/309 |
| 4,881,032 | 11/1989 | Bottomley et al. | 324/309 |
| 5,229,724 | 7/1993 | Zeiger | 324/322 |
| 5,424,645 | 6/1995 | Doty | 324/318 |
| 5,442,292 | 8/1995 | Kolem et al. | 324/322 |

OTHER PUBLICATIONS

J. A. Gerlt et al, *Nucleic Acids Symp. Ser.* 1981, 9, 11–14.
D. G. Gorenstein et al. *Phosphorus Sulfur* 1987, 30, 567–570.
H. El Abdallaoui et al, *Spectrochim. Acta. Part A* 1993, 49A, 329–338.
H.C.E. McFarlane et al. *J. Chem. Soc. Chem. Commun.* 1978, 531–532.
M.-D. Tsai *Biochemistry* 1979, 18, 1468–1472.
M.-D. Tsai et al. *Biochemistry* 1980, 19, 3531–3536.
R.S.Goody *Anal. Biochem.* 1982, 119, 322–324.
J.A.Gerlt et al. *J. Am. Chem. Soc.* 1982, 104, 2848–2856.
R.D.Sammons et al. *J. Am. Chem. Soc.* 1983, 105, 5455–5461.

(List continued on next page.)

*Primary Examiner*—Arlen Soderquist
*Attorney, Agent, or Firm*—Antonelli, Terry, Stout, & Kraus, LLP

[57] ABSTRACT

Using a mixed sample of a plurality of phosphoric acid compounds different in chemical structure as a sample for measurement, a $^{31}P$ nuclear magnetic resonance signal obtained through polarization transfer between $^{17}O$ and $^{31}P$ is observed and signals obtained without polarization transfer are eliminated, whereby $^{31}P$ nuclear magnetic resonance signal spectrum of an $^{17}O$-labeled phosphoric acid is selectively observed. For this purpose, a double resonance NMR detector capable of exciting $^{17}O$ and $^{31}P$ at the same time is connected to an NMR spectrometer, and using a pulse train which permits observation of a $^{31}P$ nuclear magnetic resonance signal obtained through polarization transfer between $^{17}O$ and $^{31}P$, a $^{31}P$ nuclear magnetic resonance signal from the $^{17}O$-labeled phosphoric acid is observed, and signals for $^{17}O$-unlabeled $^{31}P$ are eliminated.

15 Claims, 25 Drawing Sheets

CHEMICAL SHIFT

OTHER PUBLICATIONS

M.A.Reynolds et al. *J. Am. Chem. Soc.* 1983, 105, 6663–6667.
A.P.Joseph et al. *J. Am. Chem. Soc.* 1984, 106, 437–439.
M.Petersheim et al. *J. Am. Chem. Soc.* 1984, 106, 439–440.
K.Bruzik et al. *J. Am. Chem. Soc.* 1984, 106, 747–754.
K.Bruzik et al. *Biochemistry* 1984, 23, 1656–1661.
D.O.Shah et al. *J. Am. Chem. Soc.* 1984, 106, 4302–4303.
B.A.Connolly et al. *Biochemistry* 1984, 23, 5523–5527.
D.G.Gorenstein et al. *Biochemistry* 1984, 23, 6717–6723.
J.Ott et al. *Biochemistry* 1985, $24^2$, 2530–2535.
Y.–J. Shyy et al. *J. Am. Chem. Soc.* 1985, 107, 3478–3484.
J.Ott et al. *Nucl. Acids Res.* 1985, 13, 6317–6330.
R.A.Byrd et al. *J. Am. Chem. Soc.* 1986, 108, 504–505.
J.R.P.Arnold et al. *J. Biol Chem.* 1986, 261, 1985–1987.
W.D.Wilson et al. *J. Am. Chem. Soc.* 1986, 108, 7113–7114.
C.R.H.Raetz et al. *Biochemistry* 1987, 26, 4022–4027.
E.W.Hagaman *J. Am. Chem. Soc.* 1988, 110, 5594–5595.
D.G.Gorenstein et al. *Biochemistry* 1988, 27, 7223–7237.
S.A.Schroeder et al. *Biochemistry* 1989, 28, 8292–8303.
G.H.Lorimer et al. *J. Biol. Chem.* 1989, 264, 9873–9879.
F.L.Boyd et al. *J. Am. Chem. Soc.* 1990, 112, 3279–3289.
P.Bast et al. *Magn. Reson. Chem.* 1992, 30, 587–594.
S.Berger et al. *Organometallics* 1992, 11, 3481–3483.
K.S.Bruzik et al. *Biochemistry* 1992, 31, 5183–5193.
D.Gudat *Magn. Reson. Chem.* 1993, 31, 925–930.
N. J. Gibson, M. F. Brown, Biochemistry, 32, 2438–2454 (1993).
R. E. Jacobs, E. Oldfield, Progress in NMR Spectroscopy, 14, 113–116 (1981).
P. L. Yeagle, D. Kelsey, Biochemistry, 28, 2210–2215 (1989).
R. R. Ernst, G. Bodenhausen, A. Wokaun, "Principles of Nuclear Magnetic Resonance in one and two Dimensions", Oxford Science Publication (1987) (1) pp. 1–8, (2) pp. 180–183, (3) pp. 232–241.

A. Bax, R. H. Griffy, B. L. Hawkins, J. Magn. Reson., 55, 301–315 (1983).
D. M. Doddrell, D. T. Pegg, M. R. Bendall, J. Magn. Reson., 48, 323–327 (1982).
V. R. Cross, R. K. Hester, J. S. Waugh, Rev. Sci. Instrum., 47, 1486 (1976).
A. J. Meehan, C. J. Eskey, A. P. Koretsky, M. M. Domach, Biotechnology and Bioengineering, 40, 1359 (1992).
J. R. Van Wazar, R. Ditchfield, "Phosphorus Compounds and Their 31P Chemical Shifts" in C. T. Burt eds. Phosphorus NMR in Biology, CRC Press (1987).
B. Alberts, D. Bray, J. Lewis, M. Raff, K. Roberts, J. R. Watson, "Molecular Biology of the Cell", Garland Publishing, Inc., (1983) pp. 74–77.
O. W. Sorensen, R. R. Ernst, J. Magn. Reson., 51, 477 (1982).
P. O. Eriksson, L. Rilfors, G. Lindblom, G. Arvidson, Chem. Phys. Lipids, 37, 357–371 (1985).
V. J. Bartuska, G. E. Maciel, J. Magn. Reson., 42, 312–321 (1982).
K. Fukumori, T. Kurauchi, O. Kamigaito, Jounal of Applied Polymer Science vol. 38, p. 1313–1334 (1989).
S. L. Campbell–Burk, K. A. Jones, R. G. Shulman, Biochemistry, 26, 7483–7492 (1987).
J. A. Gerlt, P. C. Demou, S.Mehdi, Journal of American Chemical Society, 10, 2848 (1982).
T. R. Brown, B. M. Kincaid, K. Ugurbil, Proceedings of National Academy of Science USA, 79, 3523–3526 (1982).
R. McNamara, F. Arias–Mendoza, T. R. Brown, NMR in Biomedicine, 7, 237–242 (1994).
JP–A–60 57278.
JP–A–4 344485.
JP–A–1 305347.

POLYPHOSPHORIC ACID GROUP

CHEMICAL SHIFT ←

CHEMICAL SHIFT $^{31}P$ CHEMICAL SHIFT $^{31}$P CHEMICAL SHIFT $^{31}$P CHEMICAL SHIFT $^{31}$P CHEMICAL SHIFT

FIG. 19
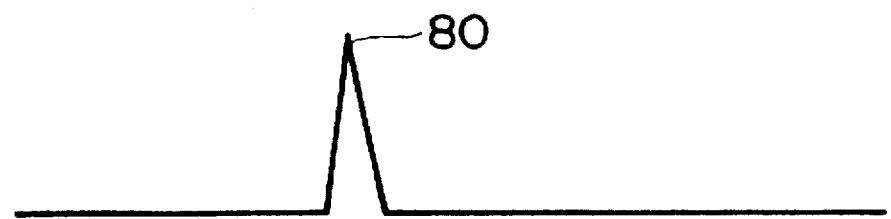
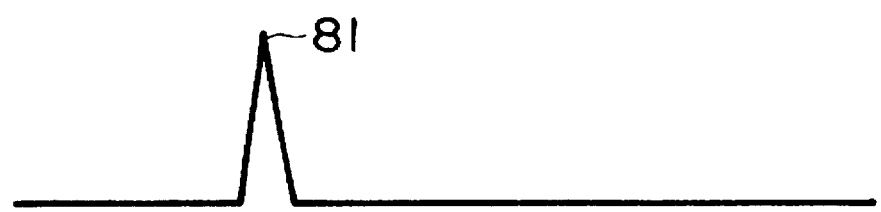
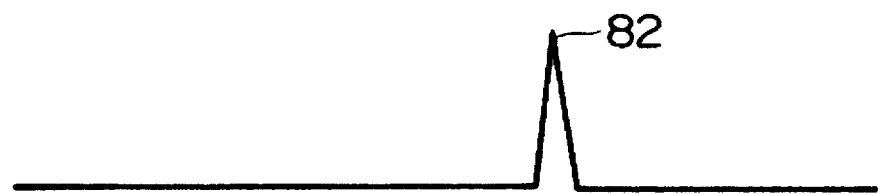
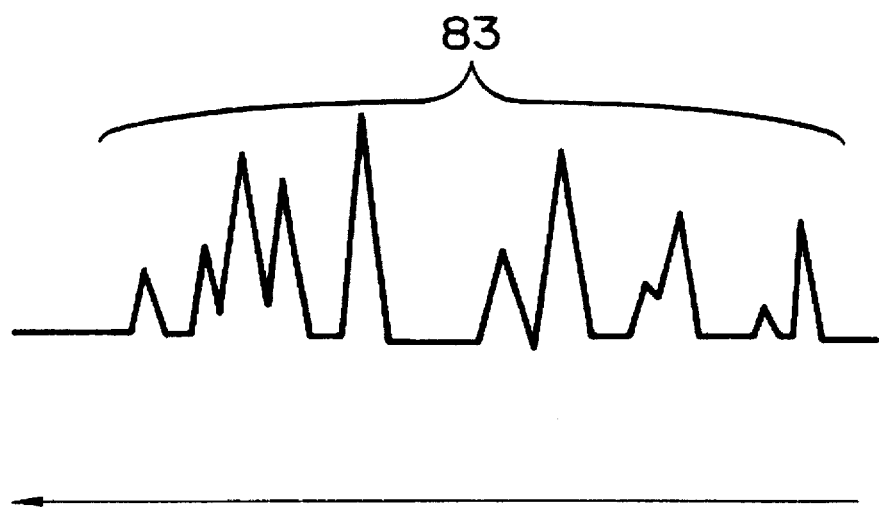
$^{31}$P CHEMICAL SHIFT $^{31}$P CHEMICAL SHIFT [ppm]

17O-LABELED PHOSPHORIC ACID COMPOUND AND METHOD AND APPARATUS FOR SELECTIVE OBSERVATION OF NUCLEAR MAGNETIC RESONANCE SIGNALS USING THE COMPOUND

BACKGROUND OF THE INVENTION

1. Field of the Invention

The present invention relates to an $^{17}$O-labeled phosphoric acid compound from which nuclear magnetic resonance (NMR) signals of $^{31}$P can be observed, a mixture containing the $^{17}$O-labeled phosphoric acid compound, and a method for selective observation of nuclear magnetic resonance (NMR) signals and an apparatus therefor which utilize the compound or the mixture.

2. Description of the Related Art

Phosphorus-31 ($^{31}$P) (atomic number 15, mass number 31) is a nuclear species which has a natural abundance of 100% and shows an observable NMR phenomenon.

As shown in FIG. 1, a phosphoric acid group is composed of a phosphorus atom, an oxygen atom having a double bond and three oxygen atoms having a single bond. The oxygen atoms having a single bond are further bonded to other atomic groups represented by $R_1$, $R_2$ and $R_3$, respectively. For example, when all of $R_1$, $R_2$ and $R_3$ are hydrogen atoms, phosphoric acid is formed. When all of $R_1$, $R_2$ and $R_3$ are phenyl groups, triphenyl phosphate is formed. There are also compounds having a poly-phosphoric acid structure formed by dehydration condensation of a plurality of phosphoric acid groups as shown in FIG. 2. For example, phosphoric acid compounds which contain adenosine in the atomic group represented by R in FIG. 2 and have two or three phosphoric acid groups linearly attached to one another are called adenosine diphosphate (ADP) and adenosine triphosphate (ATP), respectively. For distinction, the positions of phosphoric acid groups in the polyphosphoric acid are called α-position, β-position and γ-position, respectively, starting from the position next to R.

Glycerophospholipids have a structure in which two fatty acid residues are attached to a glycerol skeleton through ester linkages and an alcohol such as choline or ethanolamine is attached to the skeleton through a phosphoric diester linkage. There are also compounds having no alcohol attached to a phosphoric acid group, such as phosphatidic acid, and lyso forms having only one fatty acid residue attached through an ester linkage.

It is known that in an aqueous solution with adjusted ion concentrations, the glycerophospholipid forms a bilayer in which the polar portion containing a phosphoric acid group faces outside and the fatty acid chains face inside. In vivo, the glycerophospholipid forms a biomembrane together with other polar lipids or neutral lipids such as cholesterol. In vitro bio-chemical studies, the glycerophospholipids are often handled in the form of monolayer or multilayer liposomes obtained by forming the glycerophospholipid into spheres with a diameter of several to hundreds nanometers in an aqueous solution.

Functional membrane proteins have a specific stereostructure in the lipid bilayer and perform functions such as chemical substance reception, light response, ion transport, etc. That is, the lipid bilayer is a reaction place indispensable for the functions of the membrane proteins. For example, rhodopsin is activated by light and it is known in references [e.g. N. J. Gibson and N. F. Brown, Bio-chemistry, 32, 2438–2454 (1993)] that the production of light-activated rhodopsin is accelerated or inhibited by the changes of the chemical structure, compositions, proportions of neutral lipids, etc. of glycerophospholipids constituting the membrane.

$^{31}$P nuclear magnetic resonance spectra of glycerophospholipids constituting the lipid bilayer have a characteristic pattern called a powder spectrum as shown in FIG. 3. This spectrum is a broad-line spectrum which has a width of about 50 ppm because the molecular motion has a lower speed as compared with a homogeneous solution sample, so that the chemical shift anisotropy of $^{31}$P nucleus is not completely averaged. It is known in references [e.g. R. E. Jacobs, E. Oldfield and J. Prog, Nuclear Magnetic Resonance Spectr., 14, 113–136 (1981)] that the form and range of the spectrum reflect the properties of molecular motions of lipids, such as the change of fluidity of the membrane with a temperature rise.

As examples of recent utilization field of NMR, the investigation of properties of biomembranes and the elucidation of the relationship between the function of membrane protein and the lipid composition has become the center of interest as in references such as P. L. Yeagle, D. Kelsey, Biochemistry, 28, 2210–2215 (1989).

$^{17}$O (atomic number 8, mass number 17) is a stable oxygen isotope which has a natural isotopic abundance of 0.037% and shows an observable NMR phenomenon. It is known, for example, in ENCYCLOPAEDIA CHIMICA (Kyoritsu Shuppan Co., Ltd., 1963) that the natural isotopic abundances of oxygen isotopes are as follows: $^{16}$O 99.759%, $^{18}$O 0.204%. Neither $^{16}$O nor $^{18}$O shows NMR phenomenon.

In the case of $^{31}$P bonded to $^{17}$O in a phosphoric acid group, spin-spin coupling is responsible for spectrum splitting, but since the natural isotopic abundance of $^{17}$O is as low as 0.037%, there is hardly observed the influence of $^{17}$O on a $^{31}$P nuclear magnetic resonance spectrum of a phospholipid sample having this $^{17}$O abundance value.

The $^{17}$O-labeled phosphoric acid compounds refer to compounds which have a structure formed by attachment of four oxygen atoms to a phosphorus atom as in the structural formula shown in FIG. 4, at least one of the oxygen atoms being $^{17}$O at a rate higher than the natural abundance to label the compounds.

Polarization transfer is a phenomenon that the occupation rate of the energy level of observed nucleus is changed by transient magnetic excitation of unobserved nuclei in NMR for observing a coupled-spin system in which a heteronuclear spin-spin coupling is present. In a reference R. R. Ernst, G. Bodenhausen and A. Wokaun, Principles of Nuclear Magnetic Resonance in One and Two Dimensions, Oxford Science Publication (1987), it is known that examples of pulse sequence utilizing polarization transfer are APT, SEMUT, INEPT, DEPT, etc.

Heteronuclear Multiple Quantum Coherence (HMQC) is the pulse sequence utilizing polarization transfer described in a reference A. Bax, R. H. Griffy and L. Hawkins, Journal of Magnetic Resonance, 55, 301–315 (198).

FIG. 5 shows a timing diagram of HMQC pulse sequence. In FIG. 5, each of numerals 42 and 43 shows an interval, numeral 44 a detection period, numeral 45 the first pulse for nuclei not to be observed, numeral 46 the second pulse for the nuclei not to be observed, and numeral 47 an evolution period. Since the pulse sequence described in the reference is intended for observing two-dimensional NMR spectrum correlated with chemical shifts of hydrogen and $^{15}$N, two independent time regions, i.e., the evolution period 47 and the detection period 44 are present in the pulse train. In the reference, phase cycling of 90° step is carried out both for the $15_N$ channel first pulse 45 and for a receiver phase in order to obtain an orthogonal quadrature detection with respect to a $^{15}$N chemical shift axis corresponding to the evolution period 47. The reference discloses that a coherence to be observed can be chosen from zero-quantum coherence and two-quantum coherence by choosing phase cycling and that the phase cycling can eliminate a signal for hydrogen not bonded to $^{15}$N.

Distortionless Enhancement by Polarization Transfer (DEPT) is the pulse train utilizing polarization transfer described in a reference D. M. Doddrell, D. T. Pegg and M. R. Bendall, Journal of Magnetic Resonance. 48, 323–327 (1982). FIG. 6 shows a timing diagram of DEPT pulse train for observing $^{13}$C by irradiation with hydrogen. In FIG. 6, each of numerals 52, 53 and 55 is an interval, numeral 54 a detection period, and numeral 57 the third pulse for nuclei not to be observed. The pulse sequence described in the reference is intended for distinguishing the multiplicity of $^{13}$C spectrum, i.e., the number of hydrogen atoms bonded to a $^{13}$C atom. In the reference, a phase cycling of 180° step is carried out both for the hydrogen channel third pulse 57 in FIG. 6 and for a $^{13}$C receiver phase in the detection period 54. This phase cycling eliminates a signal for a quaternary carbon atom having no hydrogen atom bonded thereto, such as carbonyl carbon atom.

In the case of both HMQC and DEPT, signals for nuclear spins involving a heteronuclear spin-spin coupling are observed and signals for isolated spins involving no coupling are canceled.

The maximum achievable signal intensity of $^{31}$P attained through polarization transfer in the case of using a HMQC pulse train is expressed by the equation:

$$\frac{M_{PT}}{M_{FID}} = \eta f d \qquad \text{(Equation 1)}$$

wherein $M_{PT}$ is the signal intensity of $^{31}$P nucleus attained through polarization transfer, $M_{FID}$ is a signal intensity attained when resonance signals for $^{31}$P are acquired immediately after excitation by $^{31}$P first pulse, $\eta$ is an enhancement factor of polarization transfer, f is a periodic function involving the interval of an observation pulse sequence and the $^{17}$O-$^{31}$P spin-spin coupling constant of a sample, and d is transverse relaxation decay.

The enhancement factor $\eta$ corresponds to the limit of the signal intensity attained through polarization transfer and is expressed by the equation:

$$\eta = \frac{\gamma_{17_O}}{\gamma_{31_P}} \left\{ \frac{N_{17_O} S(S+1)}{N_{31_P} I(I+1)} \right\}^{1/2} \qquad \text{(Equation 2)}$$

wherein $\gamma_{17_O}$ and $\gamma_{31_P}$ are the gyromagnetic ratios of $^{17}$O and $^{31}$P, respectively, $N_{17_O}$ and $N_{31_P}$ are the numbers of atoms of $^{17}$O and $^{31}$P, respectively, in a coupled-spin system, and I and S are the nuclear spin quantum numbers of $^{31}$P and $^{17}$O , respectively. The sign of right side of the equation 2 is negative because the gyromagnetic ratio of $^{17}$O is negative the gyromagnetic ratio of $^{31}$P is positive. That is, the phase of a signal for $^{31}$P obtained through polarization transfer is inverted with respect to signals obtained without polarization transfer.

When for convenience, only four energy levels in which the central transition of $^{17}$O participates are noted among the twelve energy levels of an $^{17}$O-$^{31}$P coupled-spin system, the periodic function f is expressed by the equation:

$$f = \sin(\pi J \tau) \qquad \text{(Equation 3)}$$

wherein $\pi$ is the circular constant, J is an $^{17}$O-$^{31}$P spin-spin coupling constant, and $\tau$ is an interval in a HMQC pulse sequence.

The transverse relaxation decay d is expressed by the equation:

$$d = \exp\left(-\frac{2\tau}{T_2}\right) \qquad \text{(Equation 4)}$$

wherein $T_2$ is the transverse relaxation time of $^{31}$P.

As to observation conditions, the interval $\tau$ corresponding to, for example, the intervals shown by numerals 42 and 43 in FIG. 5 is determined as follows:

$$\tau = \frac{1}{2J} \qquad \text{(Equation 5)}$$

In this case, the sign of the periodic function expressed by the equation 3 is positive and the sign of the signal strength in the equation 1 is negative. When the condition expressed by the equation 5 is employed, the value calculated by the equation 3 becomes a maximum but observed signals involve signal attenuation by transverse relaxation expressed by the equation 4. When the transverse relaxation time $T_2$ and the interval $\tau$ are substantially equal to each other, the interval $\tau$ corresponding to, for example, the intervals shown by numerals 42 and 43 in FIG. 5 may be determined as follows in order to avoid the signal decrease by the relaxation:

$$\tau = \frac{1}{10J} \qquad \text{(Equation 6)}$$

The equation 6 shows an observation condition for convenience and the most suitable value of the waiting time $\tau$ is affected by the transverse relaxation time $T_2$.

Double resonance NMR probes are those capable of exciting two nuclei different in resonance frequency at the same time which are known in references such as V. R. Cross, R. K. Hester and J. S. Waugh, Review of Scientific Instruments, p. 1486 (1976).

Following of intracellular phosphoric acid metabolism in cultivation of a microorganism by means of $^{31}$P nuclear magnetic resonance signals is known, for example, in a reference A. J. Meehan, C. J. Eskey, A. P. Koretsky and M. M. Domach, Biotechnology and Bioengineering, Vol. 40, p. 1359 (1992). In addition, chemical shifts in the case of $^{31}$P nuclear magnetic resonance signals from phosphoric acid compounds in an organism are known, for example, in references J. R. Van Wazer and R. Ditchfield, Phosphorus Compounds and Their $^{31}$P Chemical Shifts; and C. T. Burr, Phosphorus NMR in Biology, CRC Press (1987). These references disclose that phosphoric acid compounds in an organism (e.g. creatine phosphate, phosphomonoesters, phosphodiesters, inorganic phosphoric acid, nicotinamide adenine dinucleotide (NAD), the phosphoric acid groups at the α-, β- and γ-positions, respectively, of ATP, and the phosphoric acid groups at the α- and β-positions, respectively, of ADP) can be observed as $^{31}$P nuclear magnetic resonance signal spectra.

As described, for example, in a reference B. Alberts, D. Bray, J. Lewis, M. Raff, K. Roberts and J. R. Watson, Molecular Biology of the Cell, Garland Publishing Ink (1983), it is known that when hydrolyzed into ADP and inorganic phosphoric acid, ATP liberates chemical energy in the reaction system in an amount of 11 to 13 kcal per mole and that by virtue of the chemical energy, biological reactions proceed in nerve cells, muscle cells, etc.

FIG. 7 shows a timing diagram of DEPT pulse sequence. As shown in FIG. 7, in an irradiation channel, three rf (radio frequency) pulses are applied to a sample at regular intervals (waiting times). In an observation channel, two rf pulses synchronized with the pulse applied in the irradiation channel are applied to the sample at regular intervals (waiting times) to obtain spin echoes due to the magnetic resonance phenomenon of an observed nucleus. In the first experiment, the magnetic resonance signals for the observed nucleus are received and then stored in a spectrometer. In the second experiment, signals are received with inversion of the rf phase of the third pulse in the irradiation channel and the receiver phase and added to the first signals. Consequently, signal components obtained through polarization transfer between irradiated nucleus and the observed nucleus are added up, and signal components for the observed nucleus obtained without polarization transfer are eliminated.

Typical measurement using DEPT is nuclear magnetic resonance spectrum observation in which a nucleus to be irradiated is hydrogen in a homogeneous solution sample and a nucleus to be observed is $^{13}C$. As an example of this observation, there is described below selective signal observation of a coupled spin in measurement in which a solution of a compound containing a methyl carbon atom bonded to hydrogen atoms and a carbonyl carbon atom having no hydrogen atom bonded thereto (i.e. an isolated spin), for instance, acetone is used as a sample and the flip angle of the third pulse for the nucleus to be irradiated is adjusted to 45°.

In the first signal observation, received signals obtained by the use of a predetermined pulse train are stored in a measuring instrument. The frequency spectrum of the signals involves, as schematically shown in (1) of FIG. 8, a spectrum due to a carbonyl carbon atom, i.e., an isolated spin and a spectrum due to a methyl carbon atom, i.e., a coupled spin. In the second signal observation, signals are obtained with inversion of the third pulse phase for the nucleus to be irradiated and the receiver phase.

A reference D. T. Pegg, D. M. Doddrell and M. R. Bendall, Journal of Magn. Reson., 48, 323 (1982) discloses that waiting times between pulses in a DEPT pulse train are set at 1/(2J) [wherein J is an average heteronuclear spin-spin coupling constant (in Hz unit)] in order that all of the spectrum phases of the nucleus to be observed to which the nucleus to be irradiated is bonded in different numbers may be made consistent with an absorption spectrum pattern. Phase distortion by the variation of J value can be reduced by the use of, for example, the DEPT plus pulse sequence described in a reference O. W. Sorensen and R. R. Ernst, J. Magn. Reson., 51, 477 (1982). Using the DEPT plus pulse sequence, the total interval in the pulse train can be reduced to about an half of a usual interval to prevent the decrease of the signal intensity caused by transverse relaxation.

The frequency spectrum of the signals is schematically shown in (2) of FIG. 8. A signal for the isolated spin is inverted by the phase inversion of a receiver, but a signal component obtained through polarization transfer is the same as in the first signal observation because the phase inversion of the signal due to pulse phase and the phase inversion in the receiver counteract each other. Therefore, when the signals received in the first observation and those received in the second observation are added up, the signals for the isolated spin are canceled as shown in (3) of FIG. 8, and the signals for the coupled spin are accumulated.

As shown in (4) of FIG. 8, phase correction of the spectrum gives an absorption spectrum of the coupled spin. Thus, the nuclear magnetic resonance signals for the isolated spin having no heteronuclear spin-spin coupling are canceled.

The selection of an observed signal obtained through polarization transfer is applicable to the separation of $^{31}P$ nuclear magnetic resonance spectrum of an organism tissue, such as living animal cells. When the organism tissue contains a plurality of phosphoric acid compounds similar to one another in chemical shift, such as phosphomonoesters, phosphodiesters, etc., $^{31}P$ nuclear magnetic resonance spectrum of the organism tissue exhibits an overlap of peaks in some cases as schematically shown in (1) of FIG. 9. Therefore, when an $^{17}O$-labeled phosphoric acid compound is introduced into the organism tissue and a $^{31}P$ nuclear magnetic resonance signal obtained through polarization transfer is selectively observed, signals from unlabeled phosphoric acid compounds indicated by the broken lines in (2) of FIG. 9 can be canceled as shown in (2) of FIG. 9, and observation of only the signal due to a labeled phosphoric acid group becomes possible. Low-molecular weight phosphoric acid compounds in an organism, such as adenosine triphosphate (ATP) are metabolized so that for example, ATP may be produced from adenosine diphosphate (ADP) by aerobic respiration. Thus, a plurality of physiologically active substances containing one or more phosphoric acid groups are present as a mixture thereof.

In such a system, by introducing a reagent containing an $^{17}O$-labeled phosphoric acid group from the outside of an organism, and observing a $^{31}P$ nuclear magnetic resonance signal selectively, the metabolic pathway of the reagent can be followed without inhibiting the metabolic pathway, so that the metabolism of the phosphoric acid compound in the organism can be measured.

SUMMARY OF THE INVENTION

In a conventional method for observing $^{31}P$ nuclear magnetic resonance signals, an NMR signal for an excited $^{31}P$ nucleus is non-selectively observed. That is, there is no paticular relationship between the chemical structure of a phosphoric acid compound contained in a sample for measurement and signal observation. Therefore, in the case of a mixed sample for measurement containing phosphoric acid groups different in chemical structure, there is observed overlap of $^{31}P$ nuclear magnetic resonance signals from these chemical species, respectively.

Accordingly, if a plurality of phosphoric acid compounds which differ from one another in resonance frequency by only a spectrum line width or less in spite of their different chemical structures are present in a sample, spectra are overlapped, resulting in difficult analysis.

This problem is an obstacle to analysis particularly when there is carried out broad-line $^{31}P$ nuclear magnetic resonance signal observation of a phospholipid constituting a biomembrane or there is observed a phosphoric acid compound in an organism which is present in a space having a nonuniform magnetic susceptibility, such as cells. For example, in the case of phospho monoesters, phospho diesters and inorganic phosphoric acid in an organism, a part of $^{31}P$ nuclear magnetic resonance signal spectra are overlapped. In the case of NAD, the phosphoric acid group at the α-position of ATP and the phosphoric acid group at the α-position of ADP, a part of spectra are overlapped. In the case of the phosphoric acid group at the β-position of ATP and the phosphoric acid group at the β-position of ADP, a part of spectra are overlapped.

As each of the phosphodiesters and the phosphomonoesters, there exist a plurality of chemical species different in the structure of fatty acid chain.

That is, it is very difficult to separate and measure $^{31}P$ nuclear magnetic resonance signal spectrum of ATP, ADP or NAD, or to identify a phospholipid containing a phosphodiester or a phosphomonoester from a conventional $^{31}P$ nuclear magnetic resonance signal spectrum.

An object of the present invention is to label a phosphoric acid group with $^{17}O$ and separate a $^{31}P$ nuclear magnetic resonance signal due to the labeled phosphoric acid group and those due to unlabeled phosphoric acid groups from each other by utilizing polarization transfer attributable to the spin-spin coupling of $^{31}P$ and $^{17}O$.

Another object of the present invention is to observe a $^{31}P$ nuclear magnetic resonance signal from a specific phosphoric acid compound selectively in a mixture sample containing a plutality of compounds, such as an organism tissue, microorganism cells, animal or plant cells, etc.

A further another object of the present invention is to provide a nuclear magnetic resonance probe incorporated with a radio frequency (rf) trap which has an attenuation degree higher than that of a trap composed of a series resonator alone because an rf at cutoff frequency of the trap can exist as a standing wave in the trap owing to combination of a 90° phase shifter at the cutoff frequency and a series resonant trap.

A still another object of the present invention is to provide a nuclear magnetic resonance probe in which a tuning and matching circuit and a trap resonator can be isolated from a space between magnetic poles by equipment with a probe circuit incorporated with a trap composed of a phase shifter and a resonator.

For solving the above problems, in the phosphoric acid compound used in the present invention, at least one of the oxygen atoms bonded in the phosphoric acid group portion is labeled with $^{17}O$. In the $^{17}O$-labeled phosphoric acid compound, at least one $^{17}O$ atom is chemically bonded to $^{31}P$, so that by virtue of the spin-spin coupling between these two nuclear species, there can be observed the splitting of $^{31}P$ nuclear magnetic resonance spectrum and the enlargement of the line width which are hardly observed for an unlabeled phosphoric acid compound.

In the method for selective observation of a $^{31}P$ nuclear magnetic resonance signal of the present invention, there is used a sample for measurement composed of a mixture of a plurality of compounds including a compound having a phosphoric acid group labeled with $^{17}O$ at a rate higher than the above-mentioned natural isotopic abundance, and a $^{31}P$ nuclear magnetic resonance signal due to the $^{17}O$-labeled phosphoric acid group is observed by means of a probe capable of exciting $^{17}O$ and $^{31}P$ at the same time and a spectrometer.

The nuclear magnetic resonance probe of the present invention comprises an rf trap composed of a combination of a 90° phase shifter at cutoff frequency and a resonator which assumes a low impedance state at the cutoff frequency. In addition, said probe has a structure in which a coaxial cable constituting a part of the high-frequency trap is connected between a detecting coil and a tuning and matching circuit, whereby the tuning and matching circuit can be isolated from a space between magnetic poles.

Figure 9:
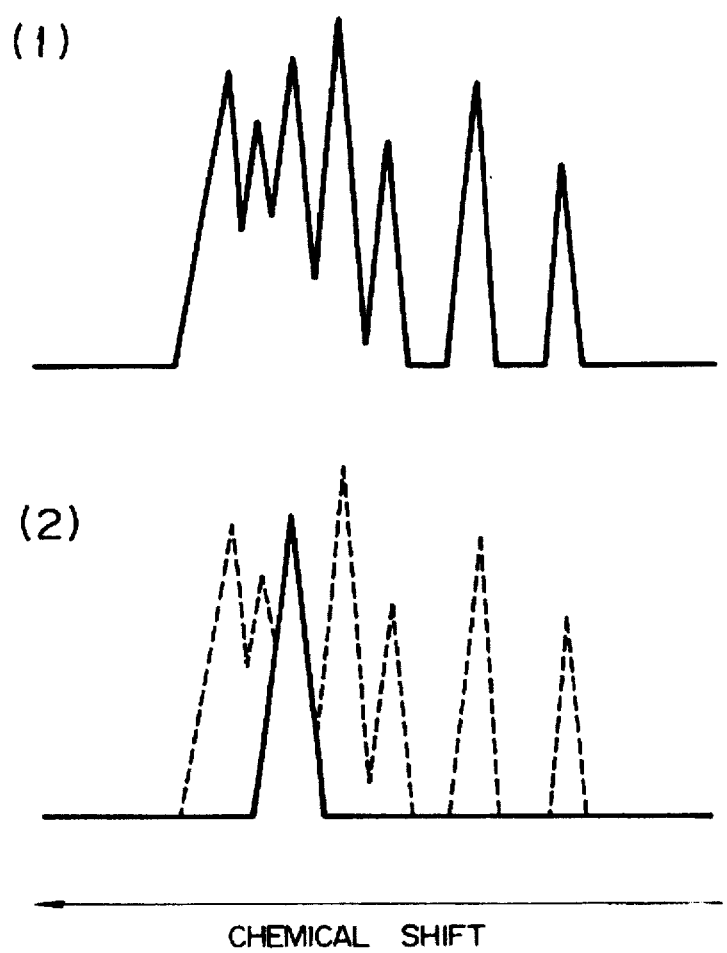
FIG. 9 is an illustration for showing cancelation of an overlap of signals by introducing an $^{17}O$-labeled compound.

(1) in FIG. 9 shows schematically that since an organism tissue contains a plurality of phosphoric acid compounds similar to one another in chemical shift, $^{31}P$ nuclear magnetic resonance spectra of the compounds are observed in an overlapped state, and (2) in FIG. 9 shows schematically that when the signals from unlabeled phosphoric acid compounds shown by the broken lines are canceled by introducing an $^{17}O$-labeled phosphoric acid compound into an organism tissue to selectively observe a $^{31}P$ nuclear magnetic resonance signal obtained through polarization transfer, observation of only the signal due to a labeled phosphoric acid group becomes possible.

Figure 10:
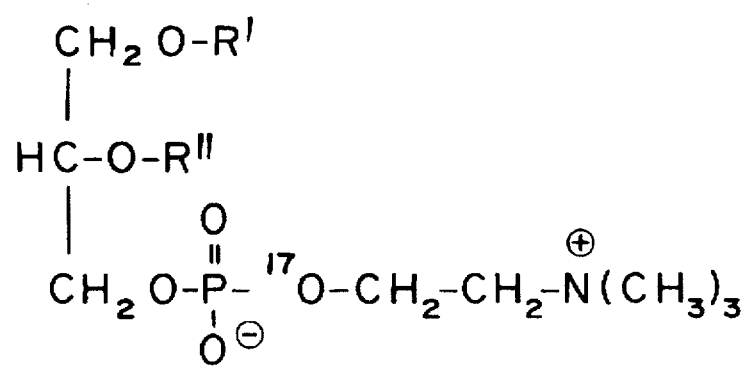

FIG. 10 shows a structural formula representing the chemical structure of an $^{17}O$-labeled phospholipid which is an example of the present invention.

Figure 11:
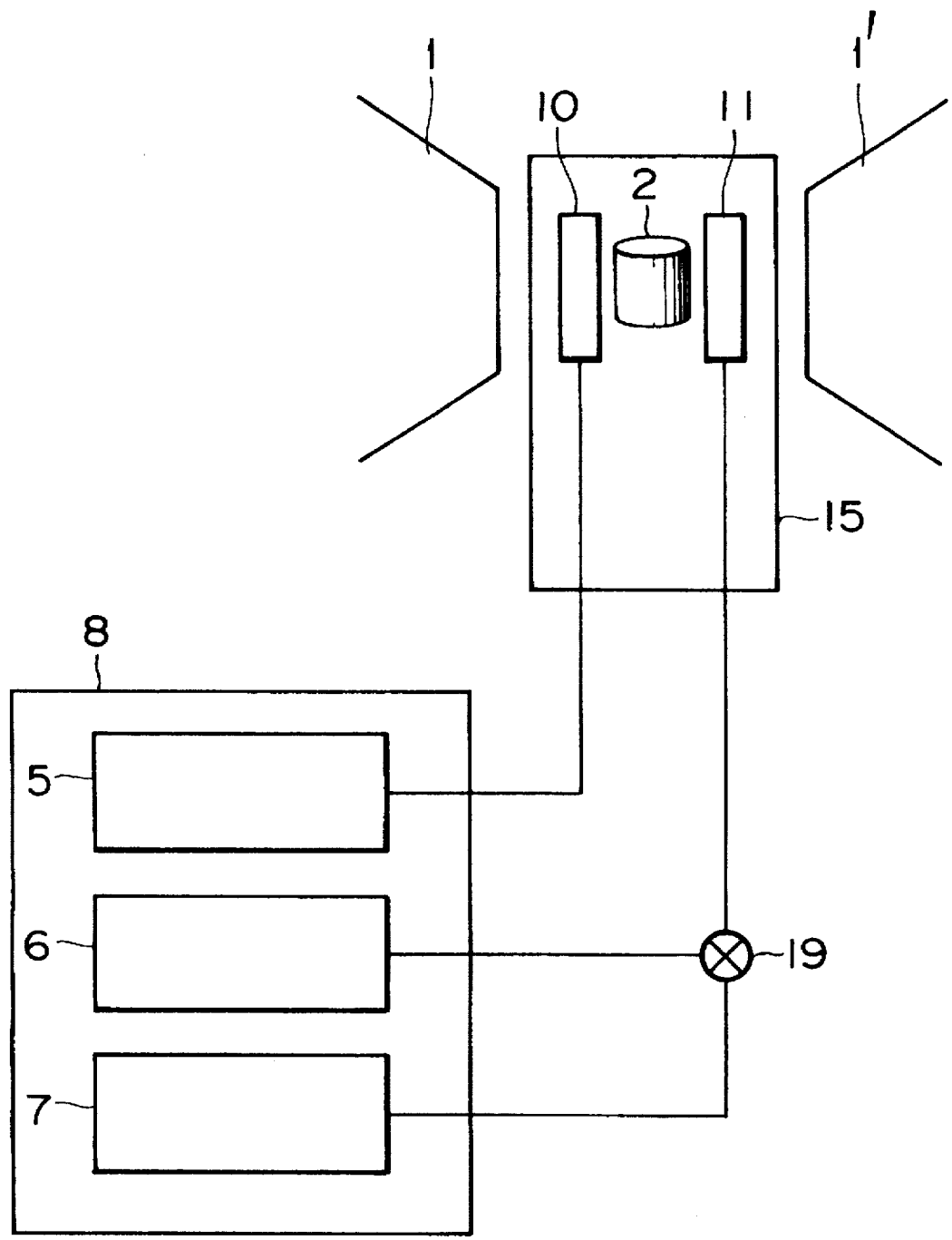

FIG. 11 is a block diagram showing the relationship among a mixed sample to be measured, an NMR probe, an NMR spectrometer and magnets in a method for selective observation of a $^{31}P$ nuclear magnetic resonance signal according to an example of the present invention.

Figure 12:
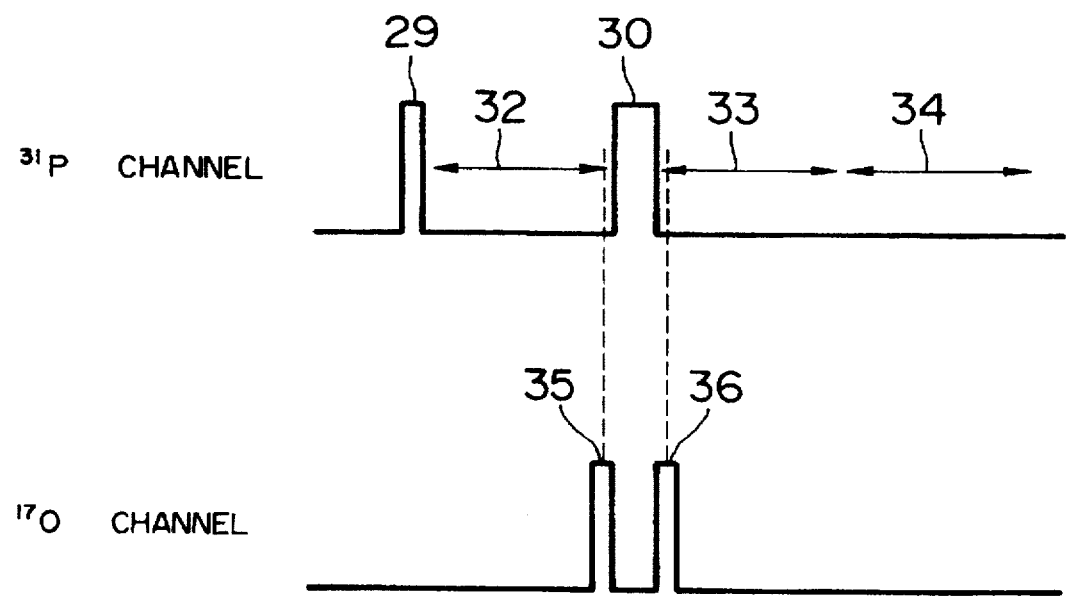

FIG. 12 shows an example of timing for explanation of a HMQC pulse sequence used in the selective observation method of the present invention.

Figure 13:
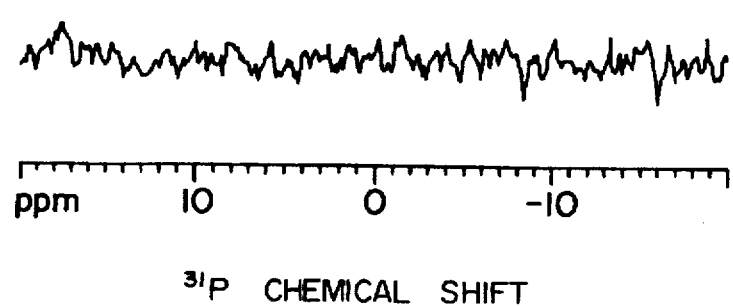

FIG. 13 shows an example of spectrum ($^{17}O$ pulse width: 1 μs) of $^{17}O$-labeled phosphoric acid obtained by a selective observation method according to an example of the present invention.

Figure 14:
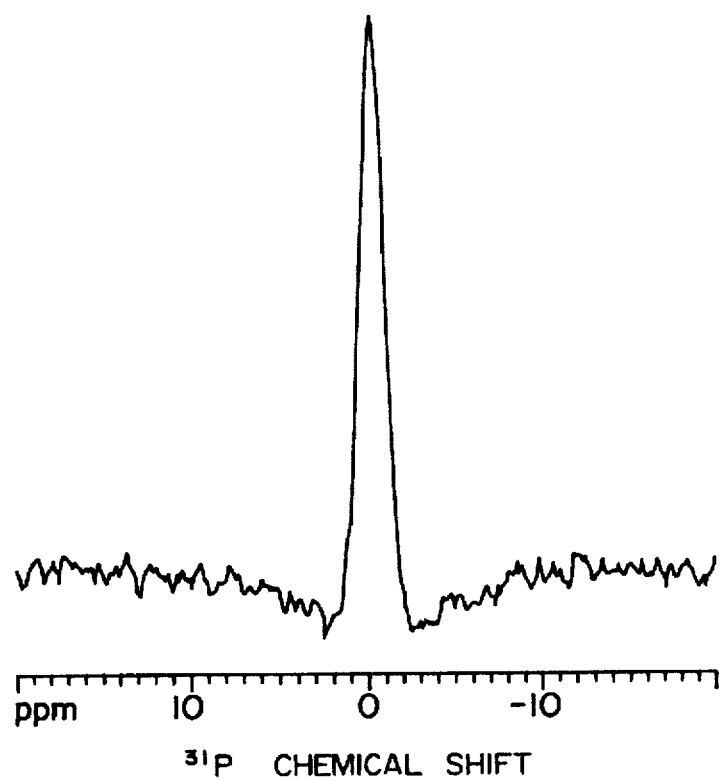

FIG. 14 shows an example of spectrum ($^{17}O$ pulse width: 100 μs) of $^{17}O$-labeled phosphoric acid obtained by a selective observation method according to an example of the present invention.

Figure 15:
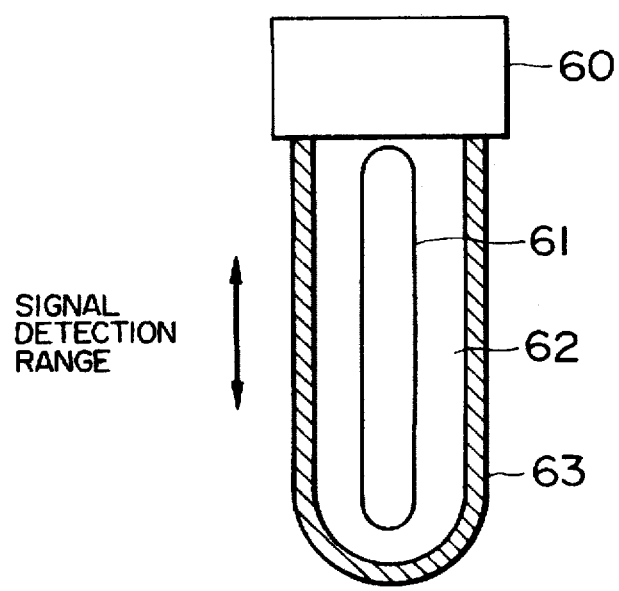

FIG. 15 shows an example of sample tube containing both labeled phosphoric acid and unlabeled pyrophosphoric acid which is placed in a space for detecting $^{31}P$ nuclear magnetic resonance signals.

Figure 16:
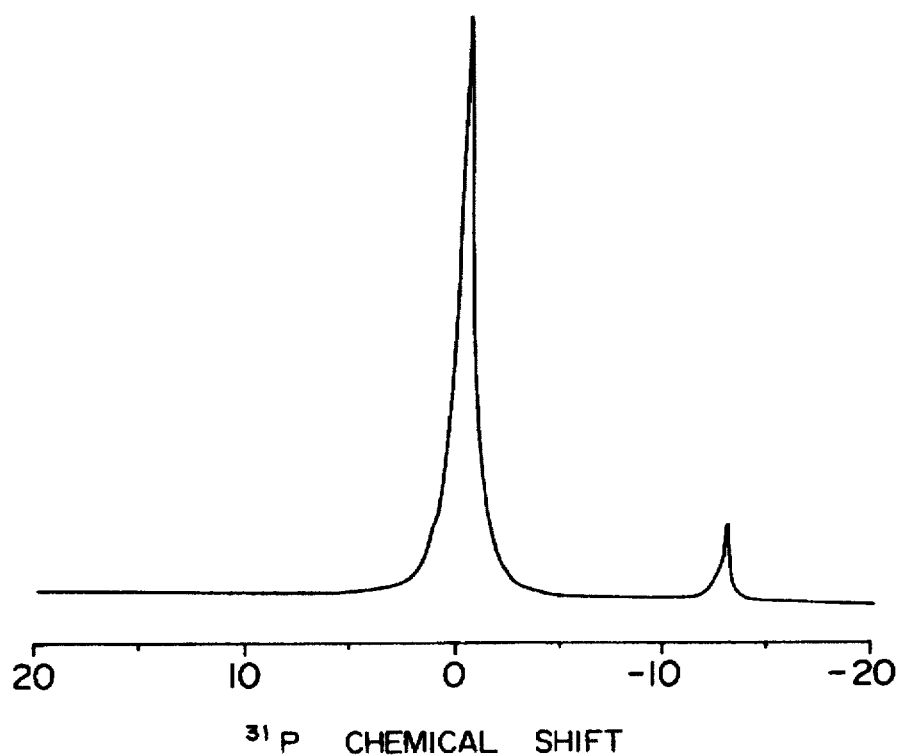

FIG. 16 shows an example of spectrum (without receiver phase cycling) of a mixed sample of labeled phosphoric acid and unlabeled pyrophosphoric acid which is obtained by a selective observation method according to an example of the present invention.

Figure 17:
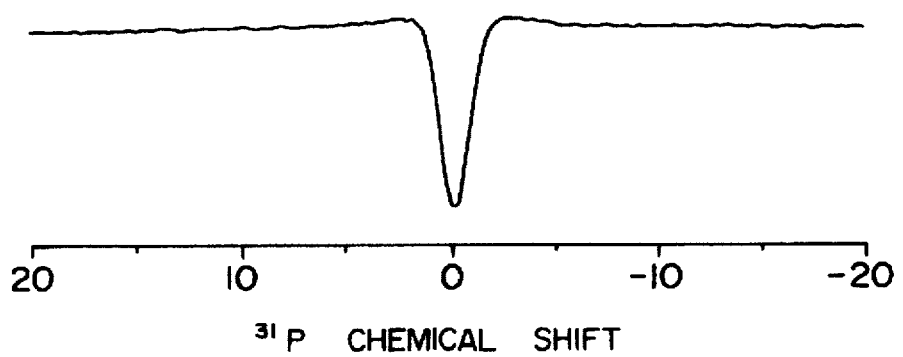

FIG. 17 shows an example of spectrum (with receiver phase cycling) of a mixed sample of labeled phosphoric acid and unlabeled pyrophosphoric acid which is obtained by a selective observation method according to an example of the present invention.

Figure 18:
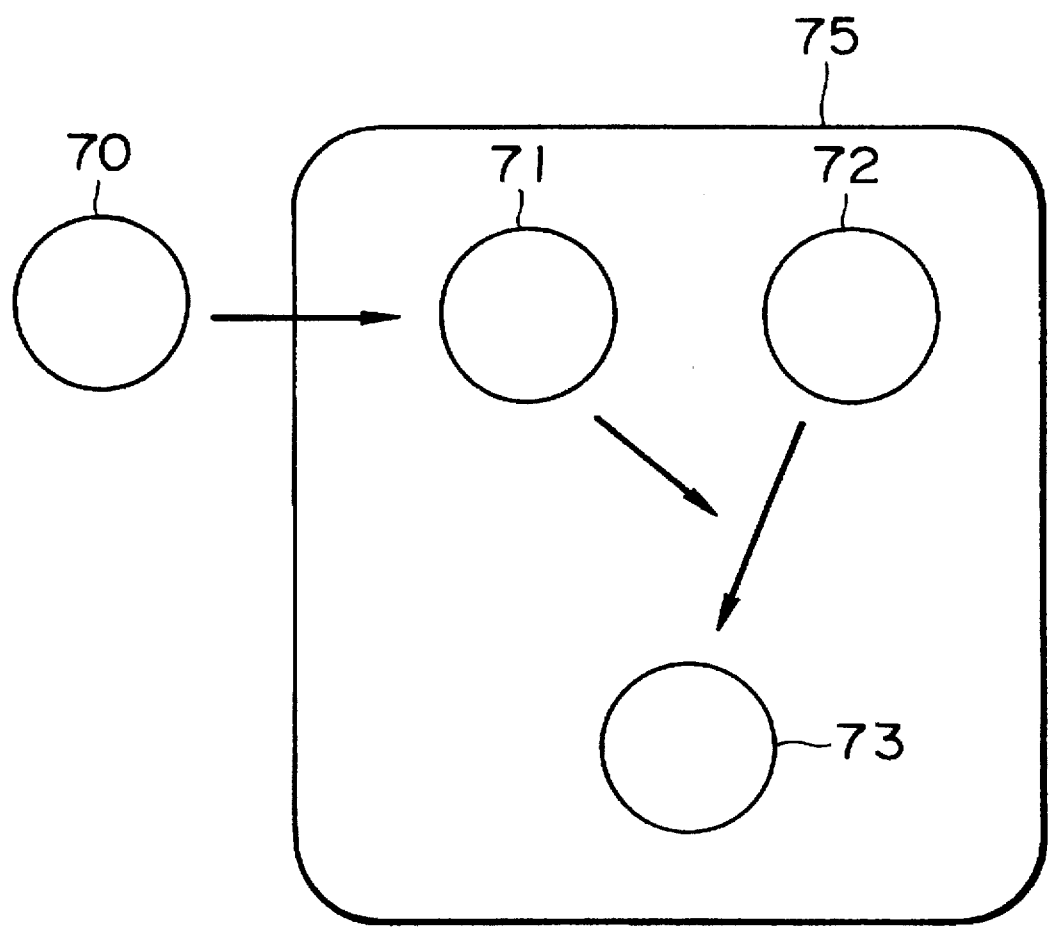

FIG. 18 is an illustration showing that $^{17}$O-labeled inorganic phosphoric acid administered from the outside of cells is incorporated into the cells and attached to ADP through a phosphoric acid metabolic pathway, resulting in synthesis of ATP.

FIG. 19 is an illustration of selective observation of a phosphoric acid metabolic system involving ATP synthetic reaction by a selective observation method according to an example of the present invention, and observation by a conventional method.

Figure 20:
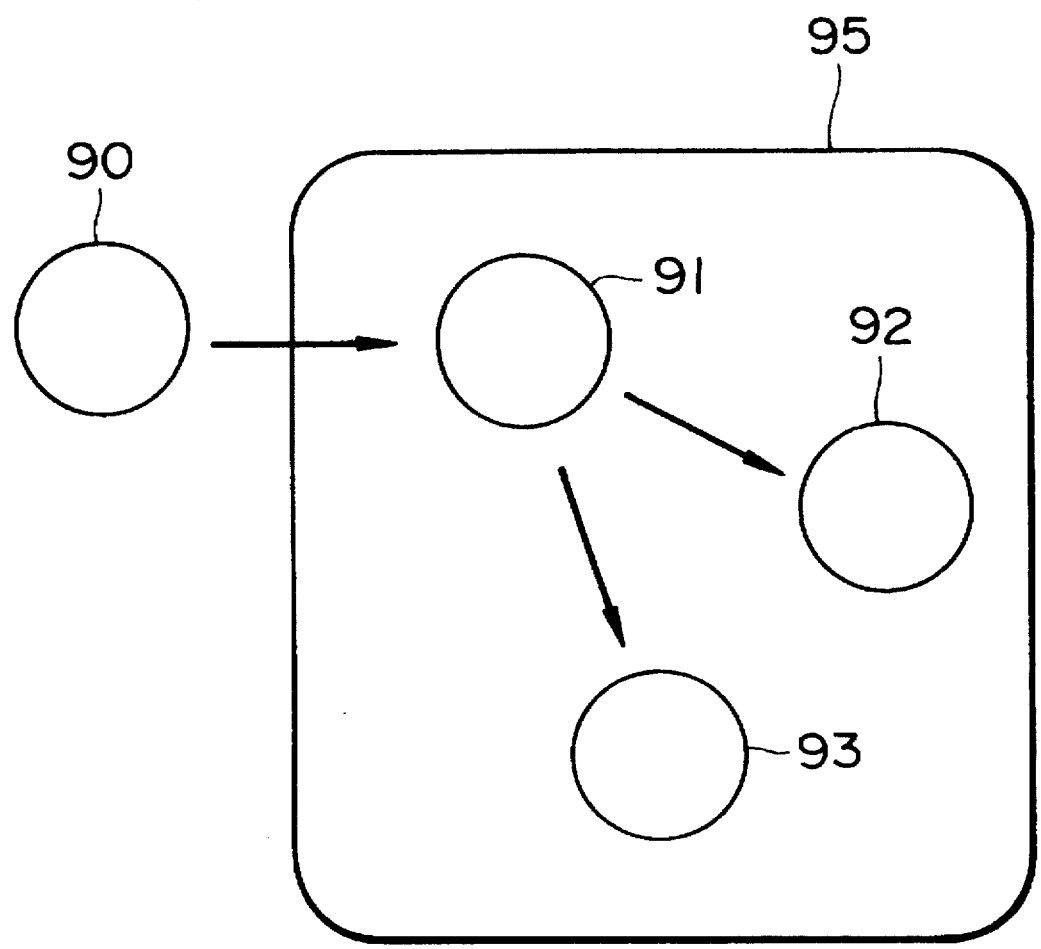

FIG. 20 is an illustration showing that $^{17}$O-labeled ATP administered from the outside of cells is incorporated into the cells and decomposed into ADP and $^{17}$O-labeled phosphoric acid through a phosphoric acid metabolic pathway.

Figure 21:
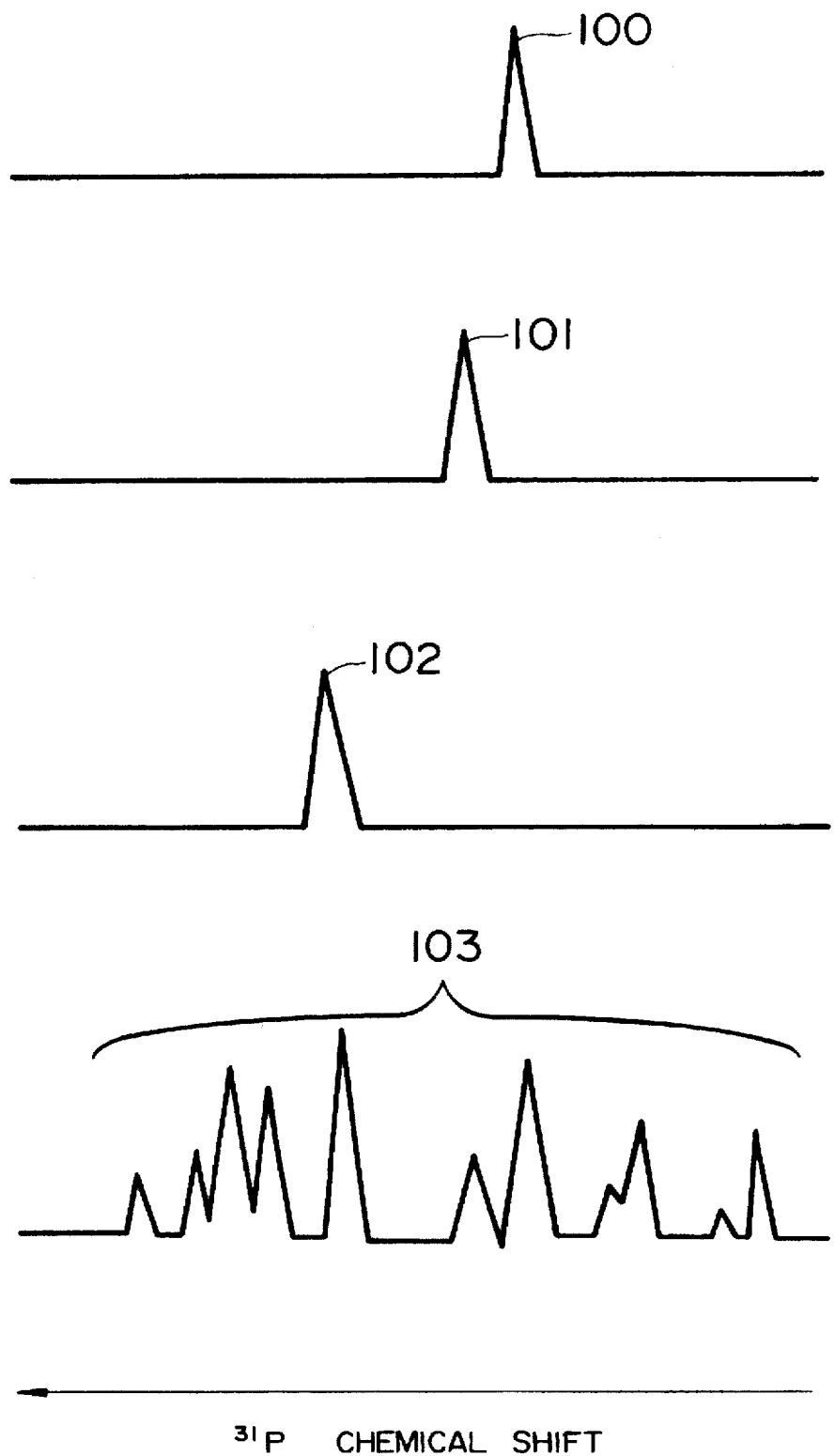

FIG. 21 is an illustration of selective observation of a phosphoric acid metabolic system involving ATP decomposition reaction by a selective observation method according to an example of the present invention, and observation by a conventional method.

Figure 22:
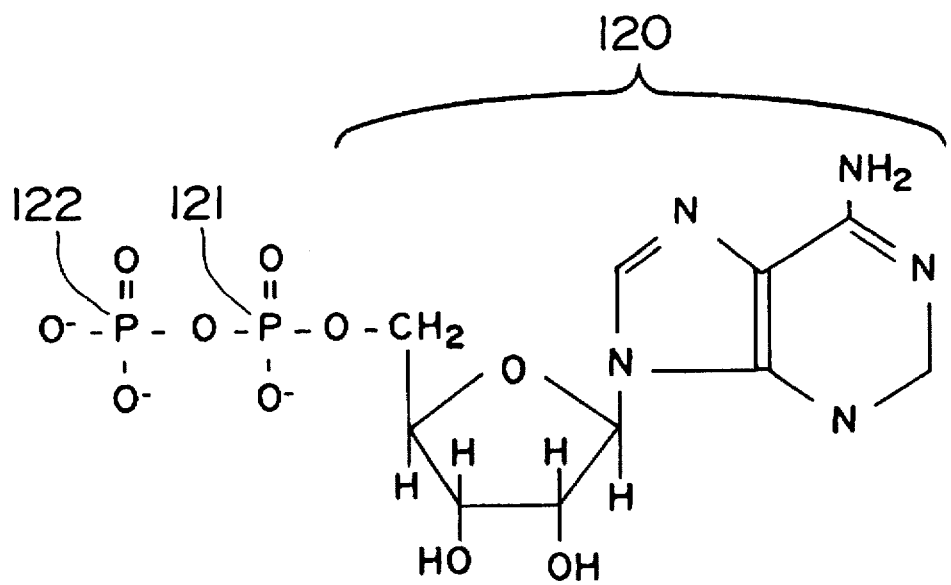

FIG. 22 is an illustration of the chemical structure of ADP and numerals for distinction between its two phosphorus atoms.

Figure 23:
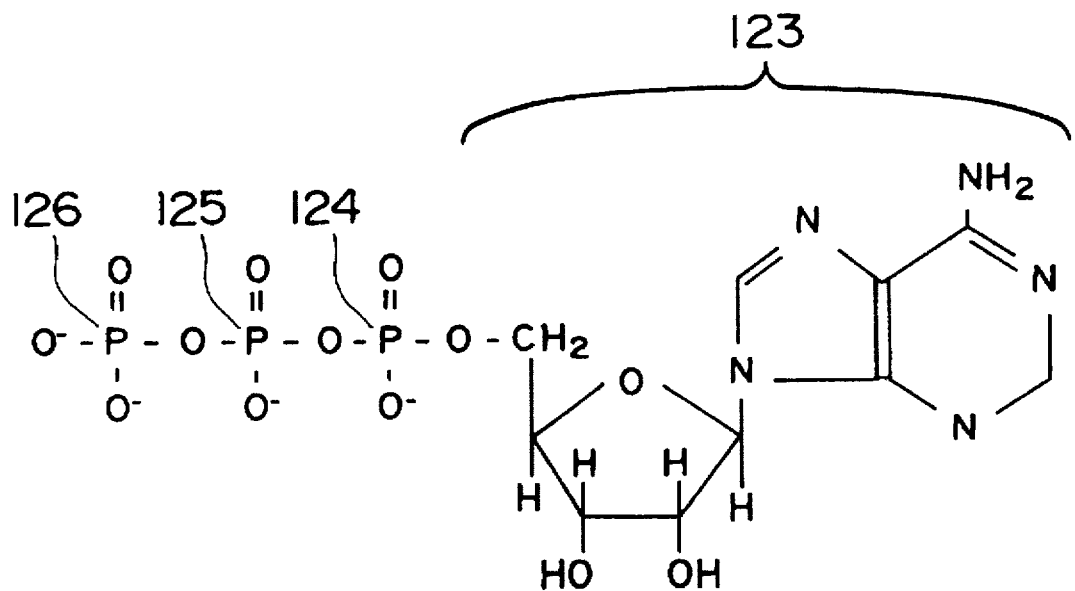

FIG. 23 is an illustration of the chemical structure of ATP and numerals for distinction between its three phosphorus atoms.

Figure 24:
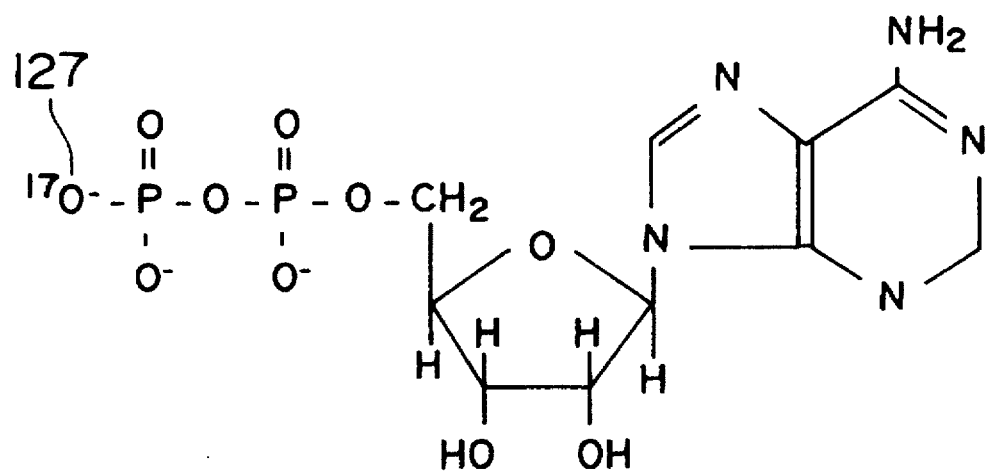

FIG. 24 shows a structural formula representing ADP in which at least one of the three hydroxyl oxygen atoms bonded to the phosphorus atom at the β-position has been labeled with $^{17}$O.

Figure 25:
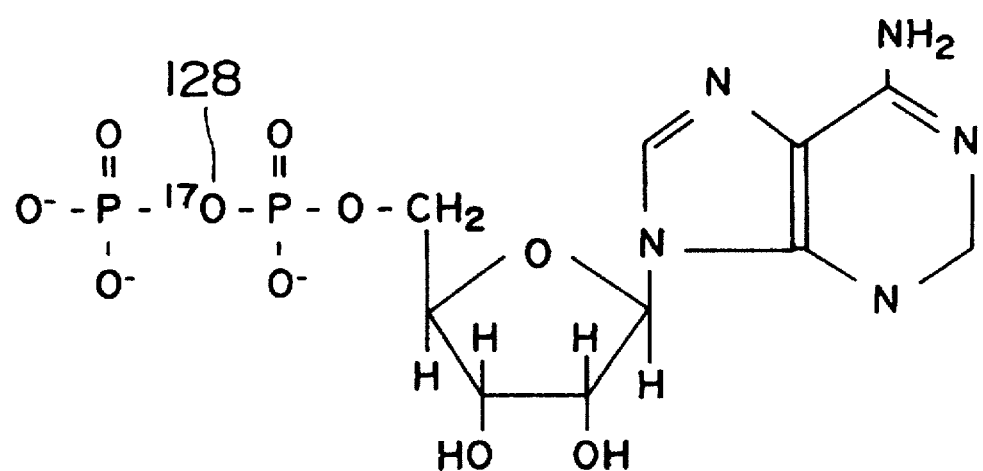

FIG. 25 shows a structural formula representing ADP in which the oxygen atom bonded to both of the phosphorus atoms at the α-position and the β-position has been labeled with $^{17}$O.

Figure 26:
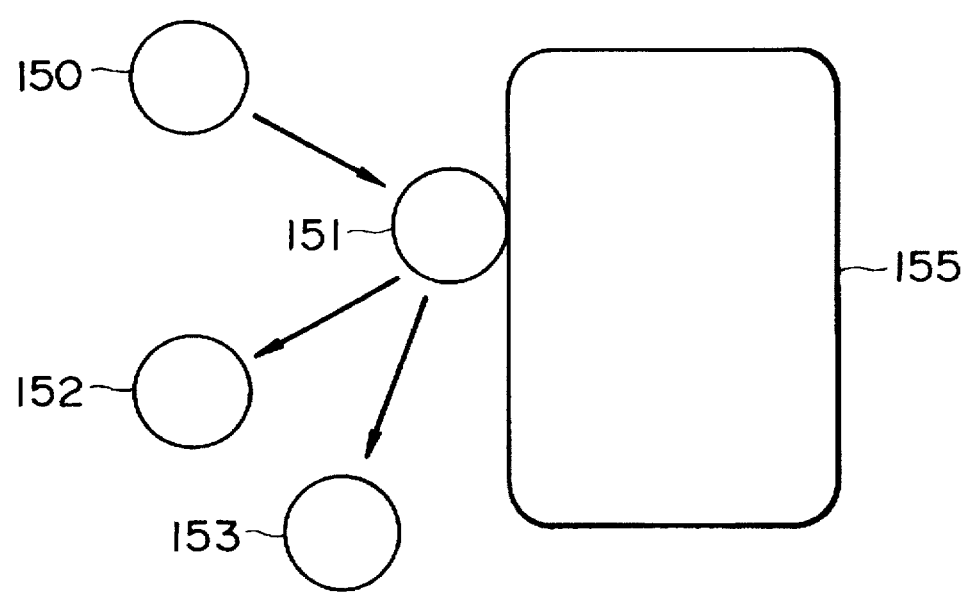

FIG. 26 is a schematic diagram showing that ATP is hydrolyzed by an enzyme having an ATP-hydrolytic function to give ADP and inorganic phosphoric acid.

Figure 27:
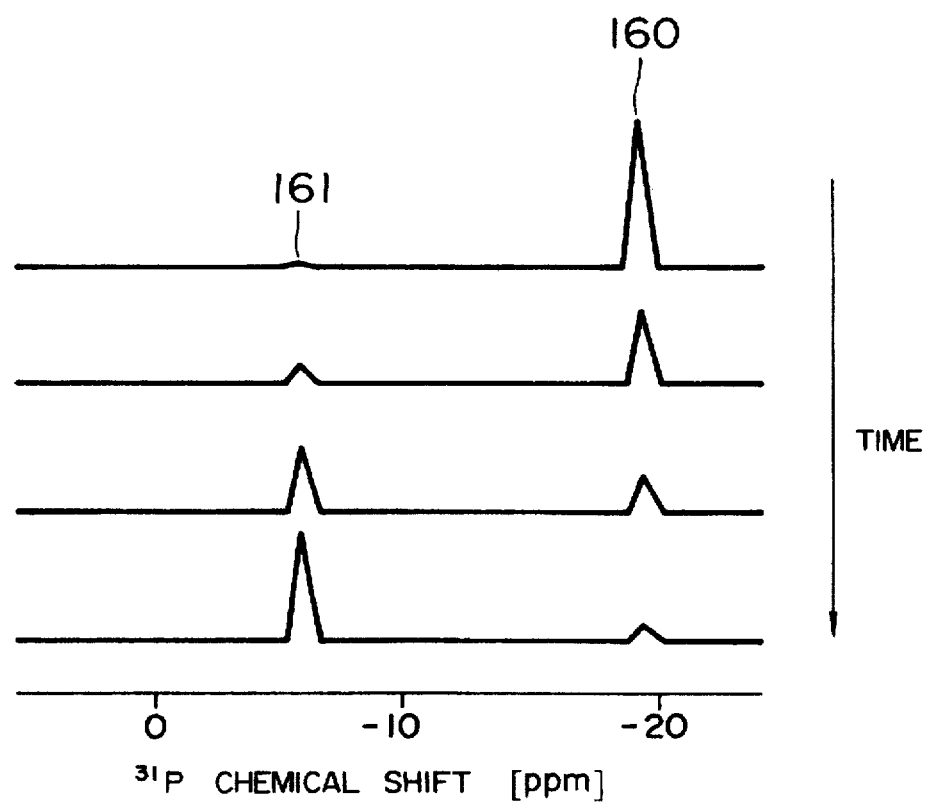

FIG. 27 is a schematic diagram showing $^{31}$P-NMR spectra obtained with the lapse of time by following a process through which ATP labeled with $^{17}$O at the β-position is hydrolyzed to give ADP labeled with $^{17}$O at the β-position, by a measuring method comprising selective observation of an NMR signal for $^{31}$P obtained through polarization transfer between $^{31}$P and $^{17}$O.

Figure 28:
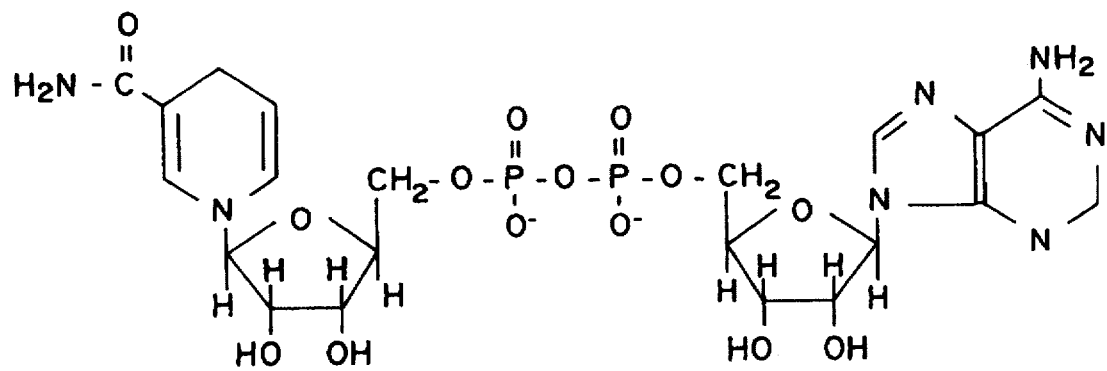

FIG. 28 is an illustration of the chemical structure of NAD.

Figure 29:
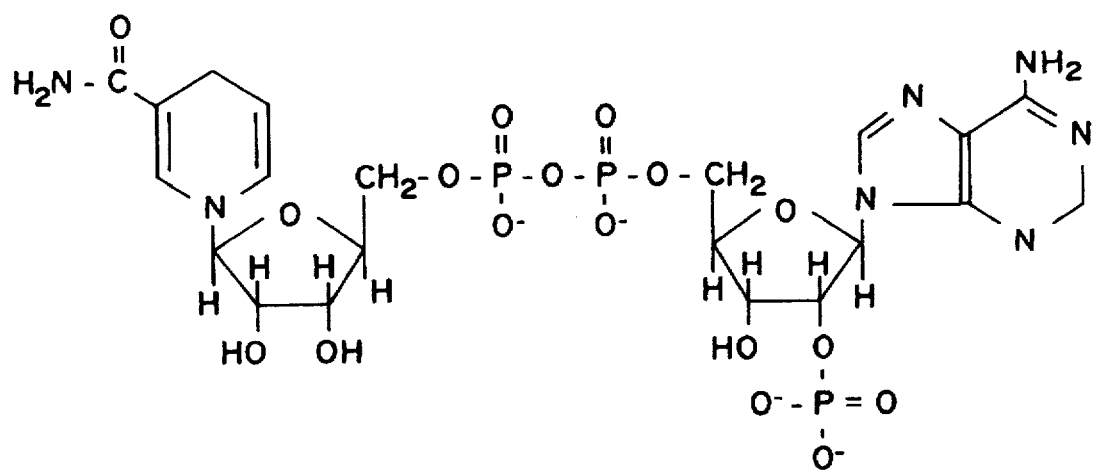

FIG. 29 is an illustration of the chemical structure of NADP.

Figure 30:
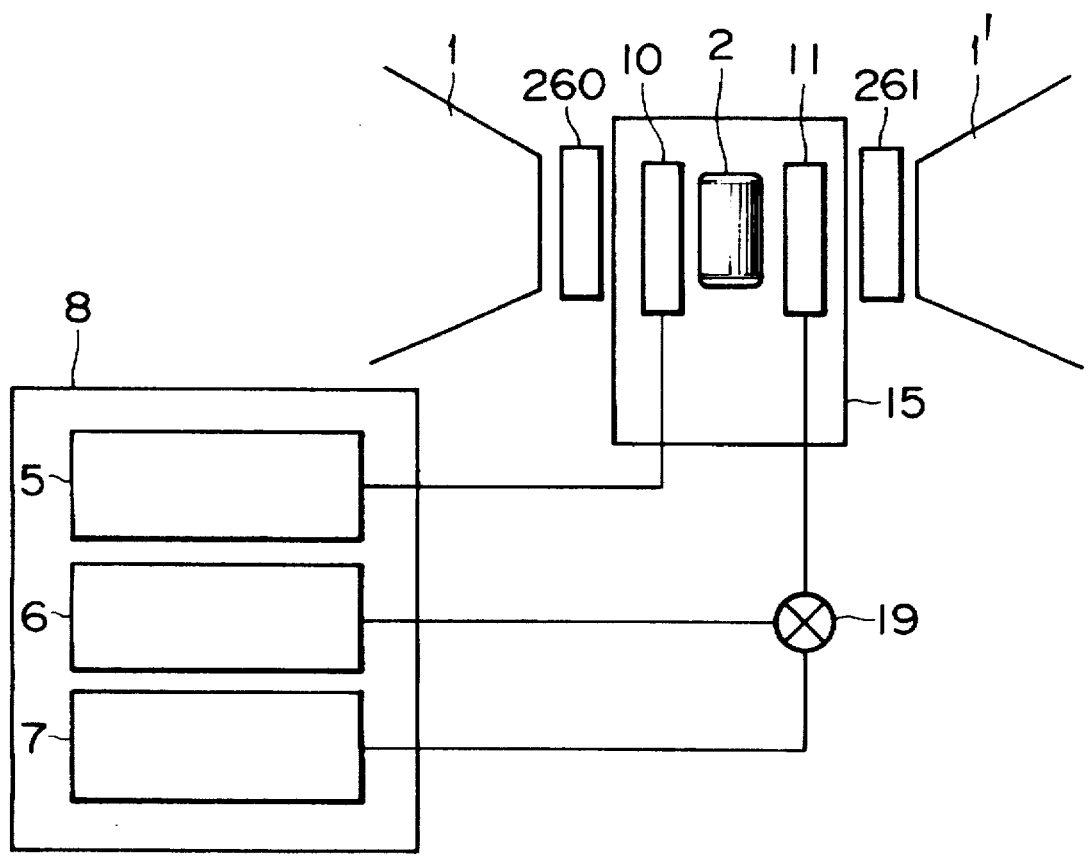

FIG. 30 is a block diagram showing the structure of a $^{31}$P magnetic resonance spectral imaging apparatus for ADP labeled with $^{17}$O at the β-position according to an example of the present invention.

Figure 31:
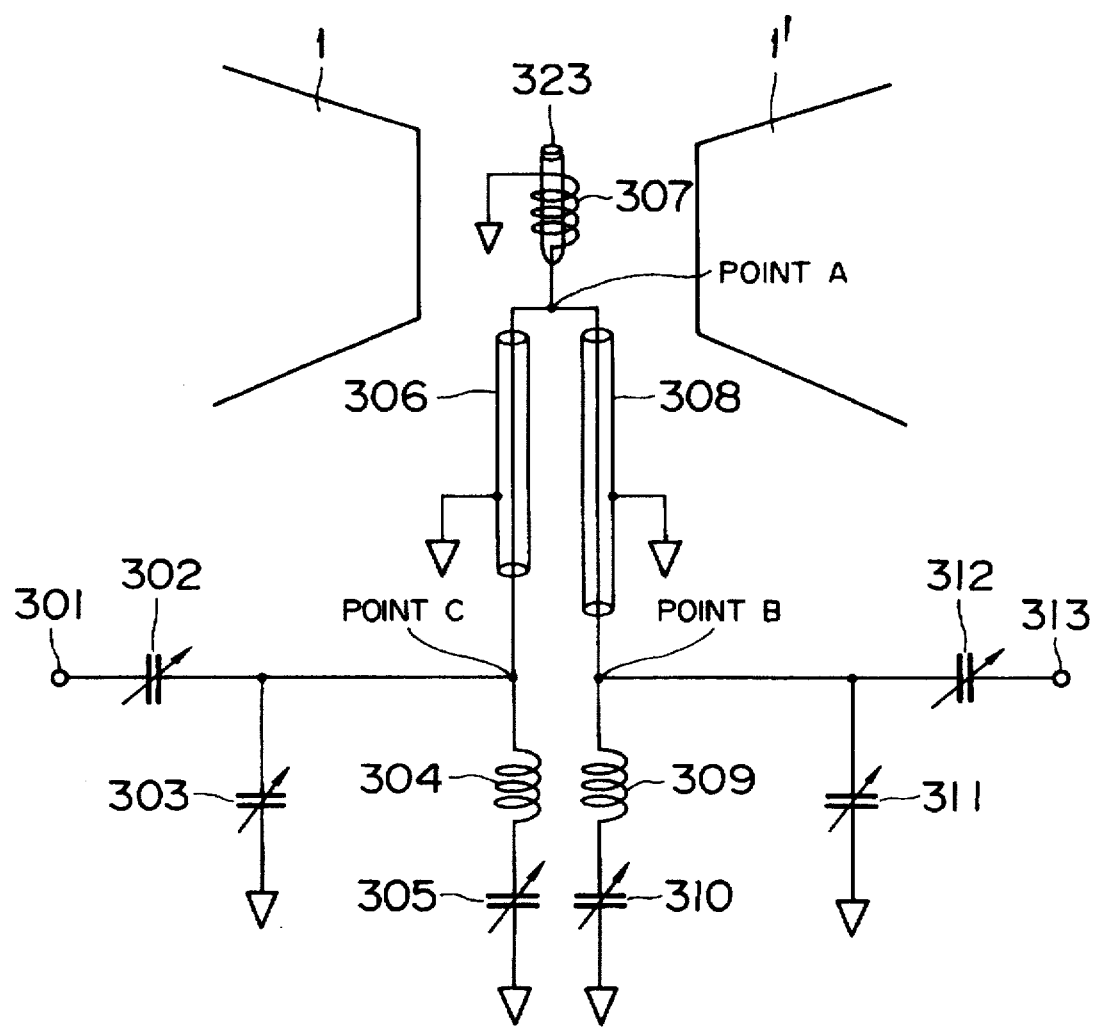

FIG. 31 shows a nuclear magnetic resonance probe circuit according to an example of the present invention.

Figure 32:
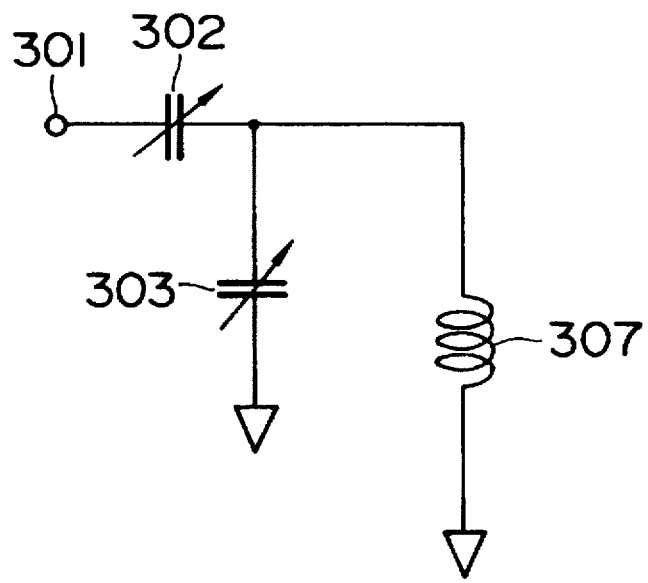

FIG. 32 shows an equivalent circuit at a frequency f1 of the double resonance circuit shown in FIG. 31.

Figure 33:
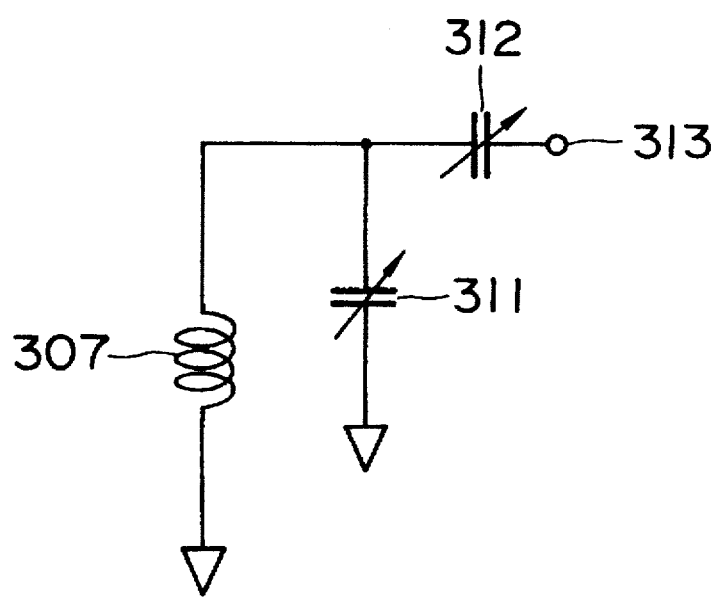

FIG. 33 shows an equivalent circuit at a frequency f2 of the double resonance circuit shown in FIG. 31.

Figure 34:
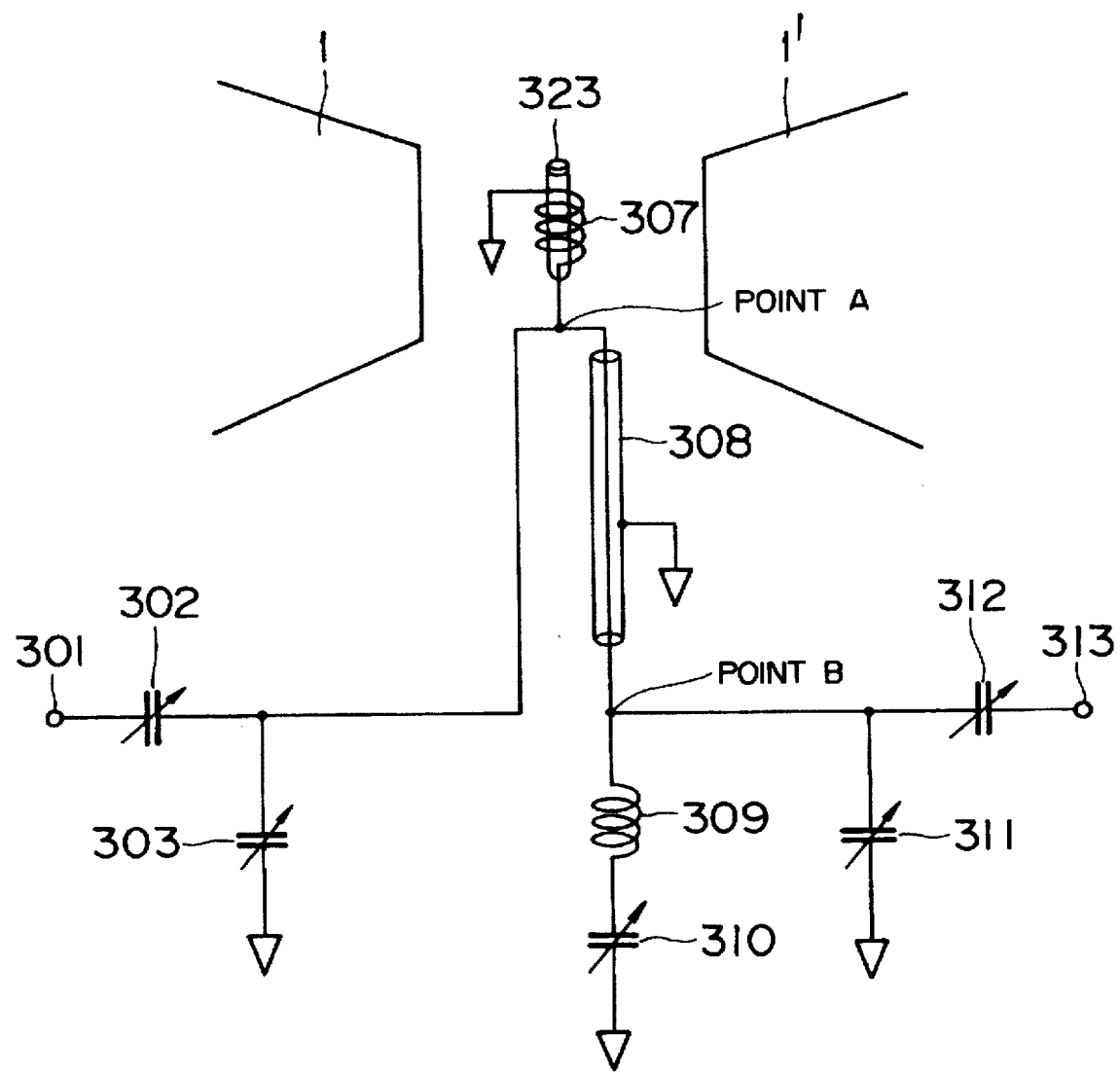

FIG. 34 is an illustration of an example of double resonance probe circuit incorporated with only the trap for interrupting the frequency f2 shown in FIG. 31, wherein the trap for interrupting the frequency f1 of the double resonance circuit shown in FIG. 31 is omitted.

Figure 35:
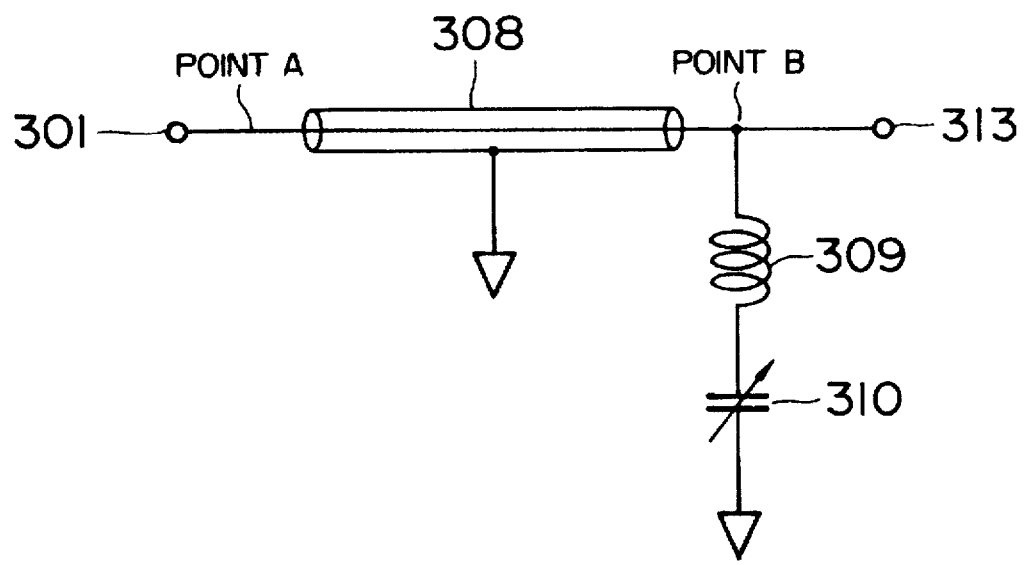

FIG. 35 is an illustration of the action of the rf trap of a probe circuit according to an example of the present invention.

Figure 36:
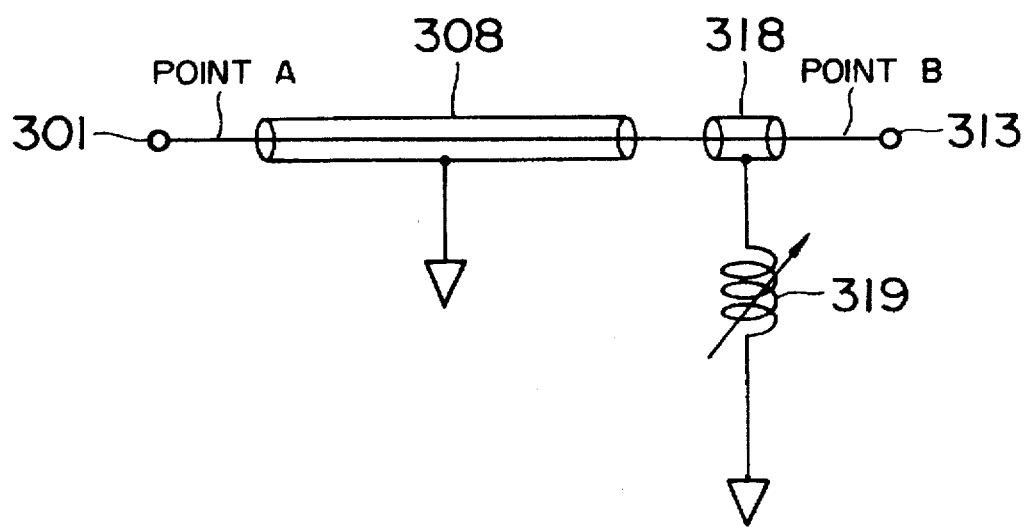

FIG. 36 is an illustration showing that in an example of the present invention, the capacitor of a resonator used in a trap is formed around a conductor inside a transmission line, whereby a phase shifter and the resonator are electrically combined.

Figure 37:
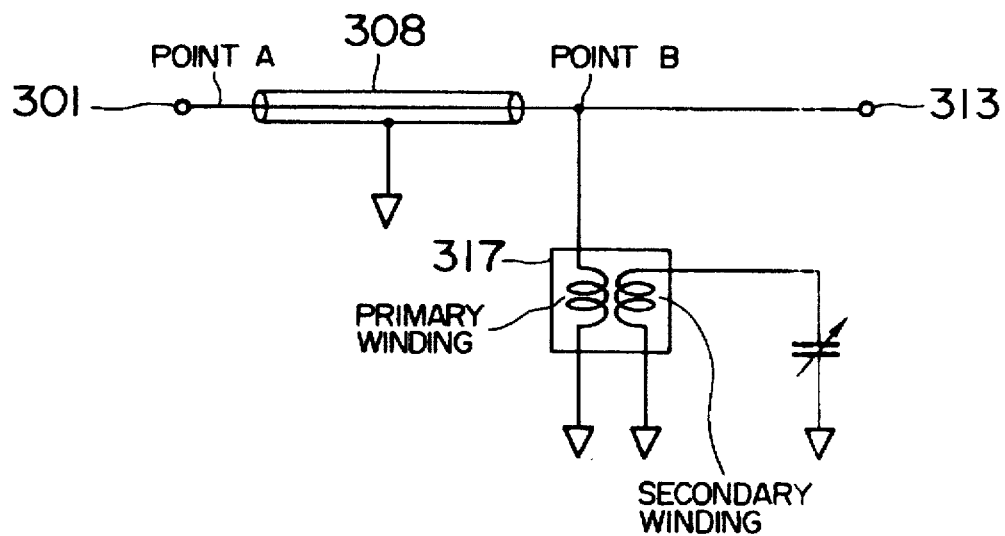

FIG. 37 is an illustration showing that in an example of the present invention, the inductance component of a resonator is realized with a high-frequency transformer secondary winding and a primary winding is connected to a conductor inside a phase shifter, whereby the phase shifter and the resonator are magnetically combined.

Figure 38:
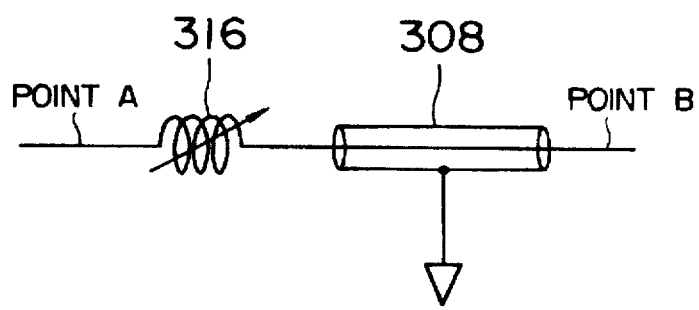

FIG. 38 is an illustration showing that in an example of the present invention, a transmission line and an inductor are used as a phase shifter used in a trap and the total phase delay at cutoff frequency is adjusted to 90° in the phase shifter.

Figure 39:
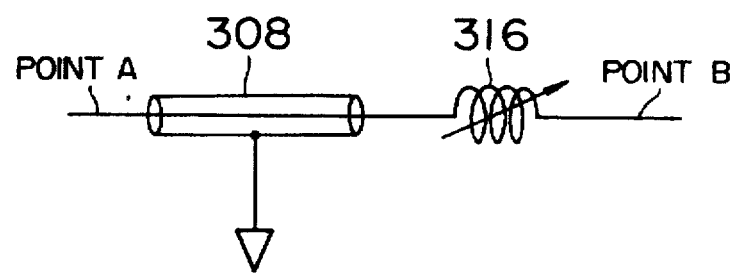

FIG. 39 is another illustration showing that in an example of the present invention, a transmission line and an inductor are used as a phase shifter used in a trap and the total phase delay at cutoff frequency is adjusted to 90° in the phase shifter.

Figure 40:
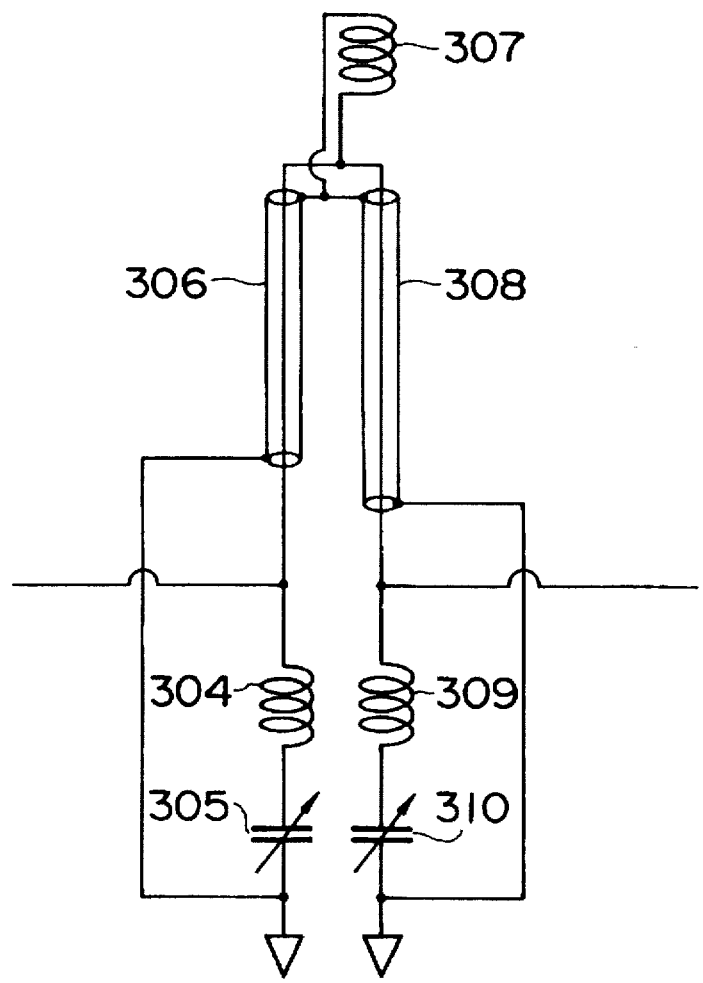

FIG. 40 is an illustration of a wiring method for grounding of a phase shifter used in a trap in an example of the present invention, in which one end of an external conductor is connected to the grounding side of a detecting coil and the other side to the grounding side of a resonator, whereby the external conductor of the phase shifter is grounded.

Figure 41:
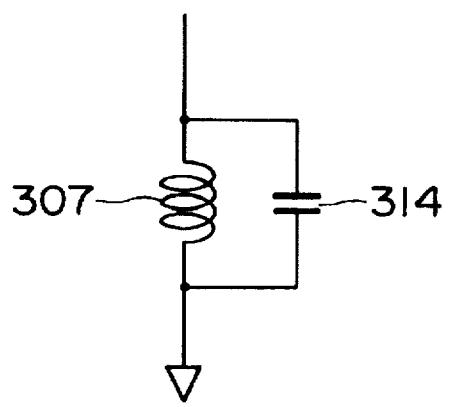

FIG. 41 is an illustration showing that in an example of the present invention, by parallel connection of a capacitor to a detection coil, mismatching of the detection coil and the characteristic impedance of a transmission line used in a phase shifter is reduced.

Figure 42:
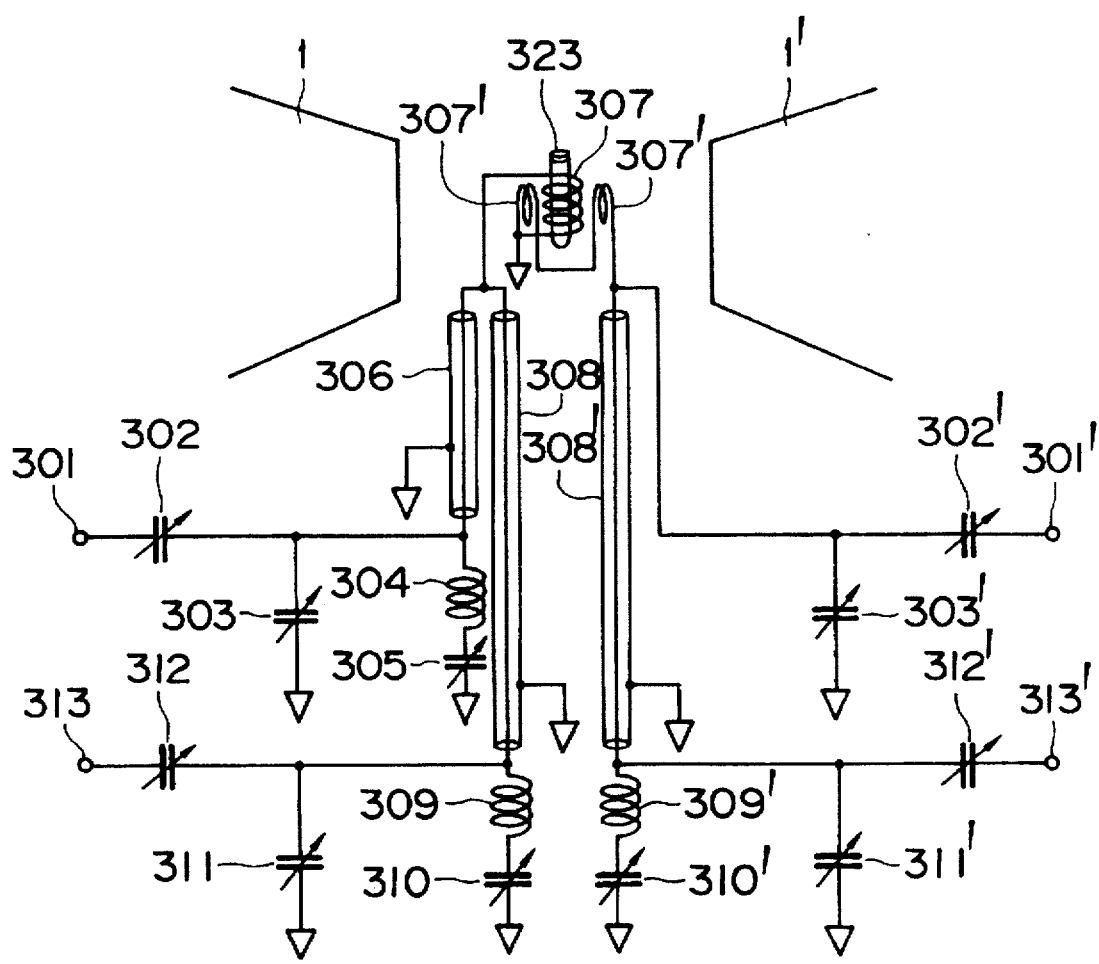

FIG. 42 is an illustration of a quadruple resonance circuit obtained by combination of double resonance circuits according to an example of the present invention.

DESCRIPTION OF THE PREFERRED EMBODIMENT

Figure 1:
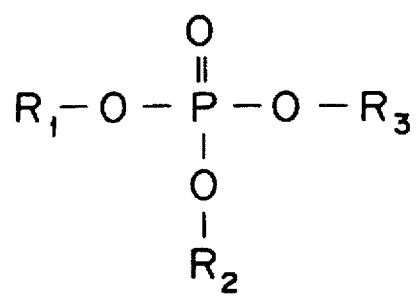
FIG. 1 shows a structural formula representing a phosphoric acid compound used in the present invention.
Figure 2:
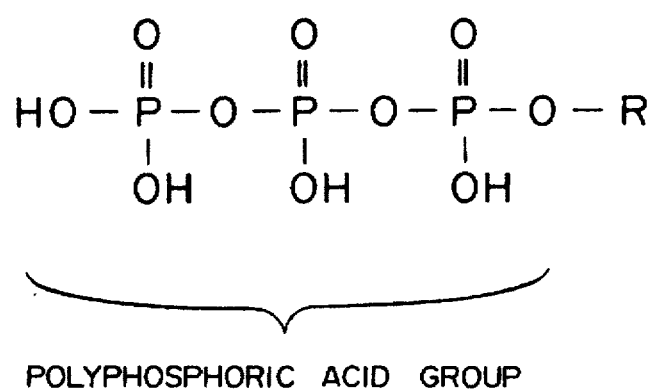
FIG. 2 shows a structural formula representing a polyphosphoric acid compound used in the present invention.
Figure 3:
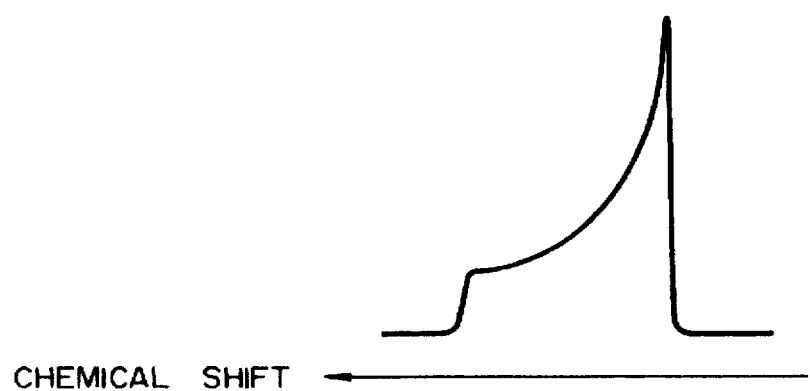
FIG. 3 is an illustration of $^{31}P$ nuclear magnetic resonance spectrum of a glycerophospholipid bilayer.
Figure 4:
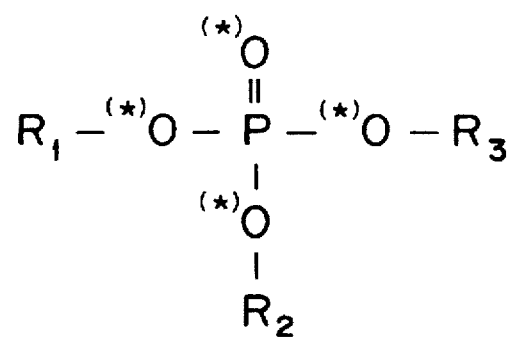
FIG. 4 shows a structural formula representing an example of $^{17}O$-labeled polyphosphoric acid compound of the present invention.

FIG. 4 is an illustration of the chemical structure of an $^{17}$O-labeled polyphosphoric acid compound according to an example of the present invention, and shows a case where at least one of the oxygen atoms marked with ★ and bonded to the phosphorus atom is labeled with $^{17}$O in order to observe polarization transfer from $^{17}$O in $^{31}$P nuclear magnetic resonance signals.

FIG. 10 is an illustration of the chemical structure of a glycerophospholipid as an example of the present invention, and shows that an $^{17}$O atom is bonded to the phosphorus atom. At least one of the four oxygen atoms of the phosphoric acid group is labeled with $^{17}$O in order to observe polarization transfer from $^{17}$O to $^{31}$P.

In this case, as the structures derived from fatty acids and represented by R' and R", respectively, any structures may be used so long as they enable the glycerophospholipid to form a lipid bilayer. The fatty acids include lauric acid, myristic acid, palmitic acid, stearic acid, oleic acid, etc. The glycerophospholipid may be a lyso form having only one structure derived from the fatty acid. In addition, although choline is shown in FIG. 10 as the structure derived from a base and bonded to the phosphoric acid group, any structure derived from a base may be used as said structure so long as it enables the glycerophospholipid to form a lipid bilayer. The base includes serine, ethanolamine, etc. A phosphatidic acid structure having no base attached thereto may also be used.

The $^{17}$O isotopic labeling rate in a certain specific glycerophospholipid such as dipalmitoylphosphatidylcholine may be such that a $^{31}$P nuclear magnetic resonance spectrum involving spin-spin coupling between $^{31}$P and $^{17}$O can be selectively observed in distinction from unlabeled $^{31}$P nuclear magnetic resonance spectra by the use of a pulse sequence utilizing polarization transfer. The $^{17}$O isotopic labeling ratio may be tens percent or less.

FIG. 11 is a block diagram showing mainly a measuring apparatus for practicing the method for selective observation of a $^{31}$P nuclear magnetic resonance signal of the present invention.

The magnets 1 and 1' are the magnets of a nuclear magnetic resonance (NMR) apparatus, and for example, superconducting magnets having a magnetic flux density at the center of magnetic field of 11.7 T are used as the magnets 1 and 1'. At this magnetic flux density value, the resonance frequency of $^{31}$P is about 202 MHz and that of $^{17}$O is about 67.8 MHz. As the sample 2, both a phosphoric acid compound containing an $^{17}$O-labeled phosphoric acid group (hereinafter referred to as "compound A") and a phosphoric acid compound containing $^{17}$O at the natural abundance of (hereinafter referred to as "compound B") are held in a glass tube or the like and placed so that both the compound A and the compound B may be magnetically excited by an $^{17}$O irradiating coil 10 and a $^{31}$P irradiating and observing coil 11. The probe 15 is a double resonance NMR probe capable of exciting $^{17}$O and $^{31}$P at the same time and has the sample 2, the irradiating coil 10 and the $^{31}$P irradiating and observing coil within. The probe 15 is set so that the sample 2 may be located at the center of magnetic field of the magnets 1 and 1'. The $^{17}$O irradiating coil 10 is connected to the $^{17}$O irradiating circuit 5 of an NMR spectrometer 8. The $^{31}$P irradiating and detecting coil 11 is connected to a transfer switch 19 which is connected to the phosphorus irradiating circuit 6 and the receiver 7 of the NMR spectrometer 8. When the sample 2 is magnetically excited, the transfer switch 19 connects the $^{31}$P irradiating circuit 6 and the $^{31}$P irradiating and observing coil 11 and disconnects the receiver 7. When $^{31}$P nuclear magnetic resonance signals from the sample 2 are received, the transfer switch 19 connects the $^{31}$P irradiating and detecting coil 11 and the receiver 7 and disconnects the $^{31}$P irradiating circuit 6.

The NMR probe 15 may have a function of irradiating hydrogen nucleus for eliminating $^{1}$H-$^{31}$P spin-spin coupling and a function of irradiating deuterium for carrying out magnetic field lock, in addition to the function of irradiating $^{17}$O and $^{31}$P. The $^{17}$O irradiating coil 10 and the $^{31}$P irradiating and observing coil 11 may be independent of each other as in FIG. 11, or there may be used a single-coil double resonance probe for $^{17}$O and $^{31}$P obtained by connecting a double resonance circuit to a single coil as in the example described hereinafter. Any type of resonance circuit may be connected to each of the coils.

It is sufficient that the $^{31}$P nucleus of the phosphoric acid group contained in each of the compound A and the compound B is magnetically excited. These compounds may be mixed so as to be in contact with each other, or may be isolated from each other so as not to be in contact with each other. As a support for the sample, a glass tube with one end closed, etc. may be optionally used. The following is also possible: a solution containing a mixture of the phosphoric acid compounds, such as a culture broth of a microorganism is prepared in a container placed outside the probe 15 and introduced to the position of the sample 2 at the center of magnetic field through a silicone tube or the like, followed by measurement.

Figure 5:
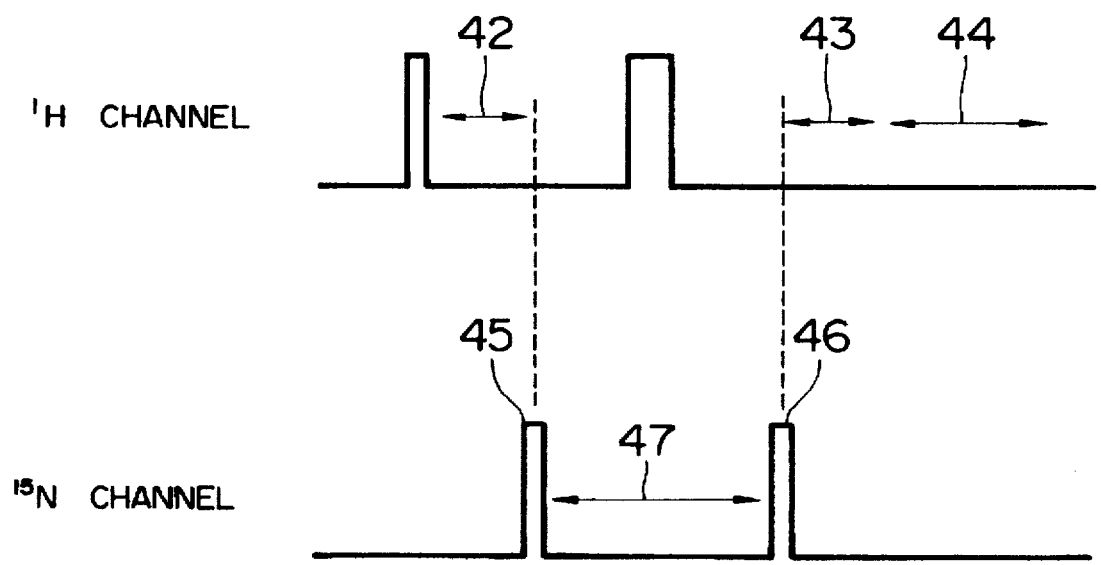
FIG. 5 shows an example of timing for explanation of a well-known HMQC pulse train correlated with $^{15}N$-$^1H$ two-dimensional chemical shift.
Figure 6:
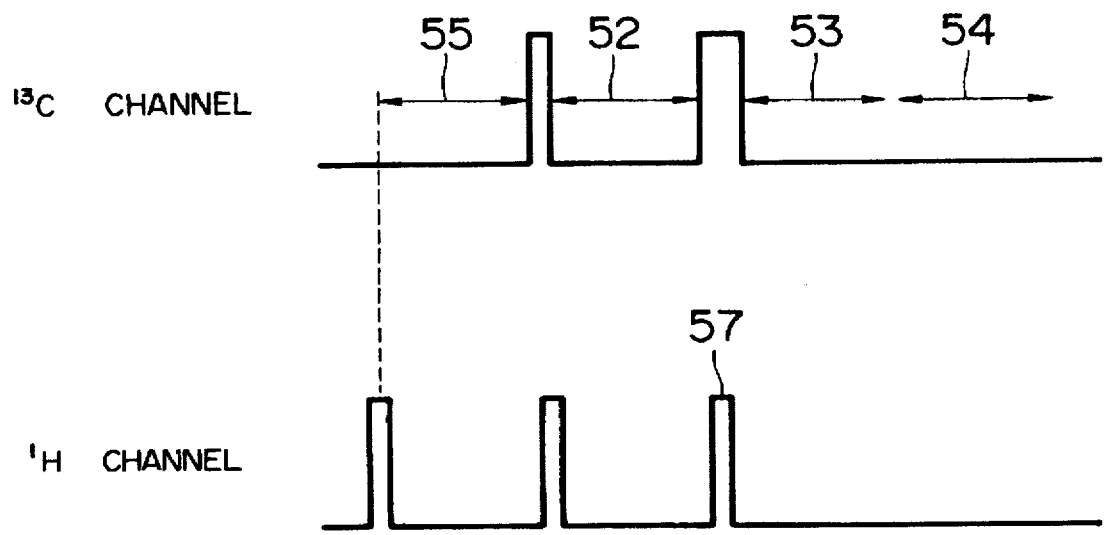
FIG. 6 shows an example of timing for explanation of a well-known $^{13}C$ DEPT pulse sequence.
Figure 7:
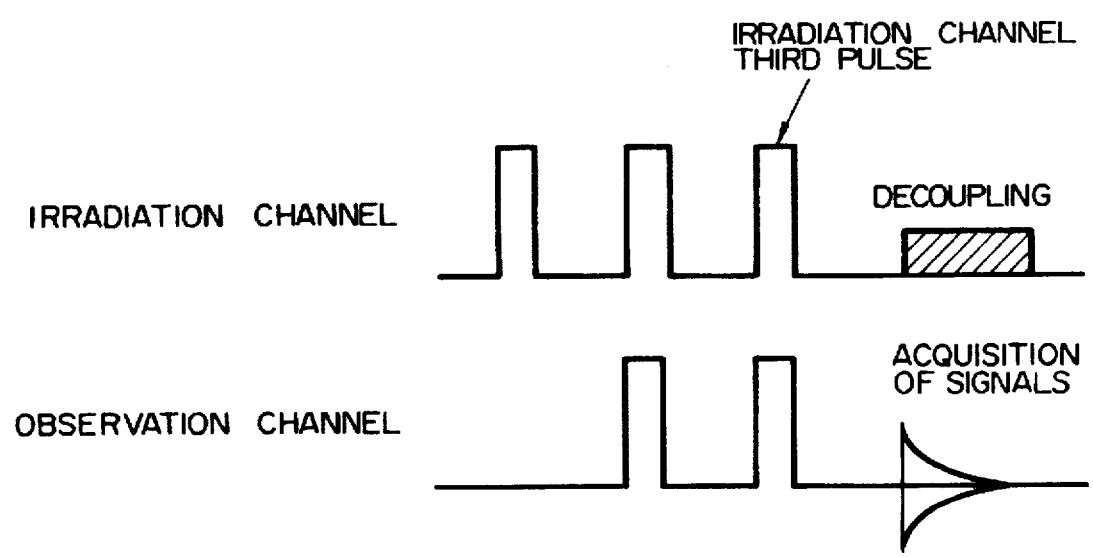
FIG. 7 is an illustration of timing in a DEPT pulse sequence.
Figure 8:
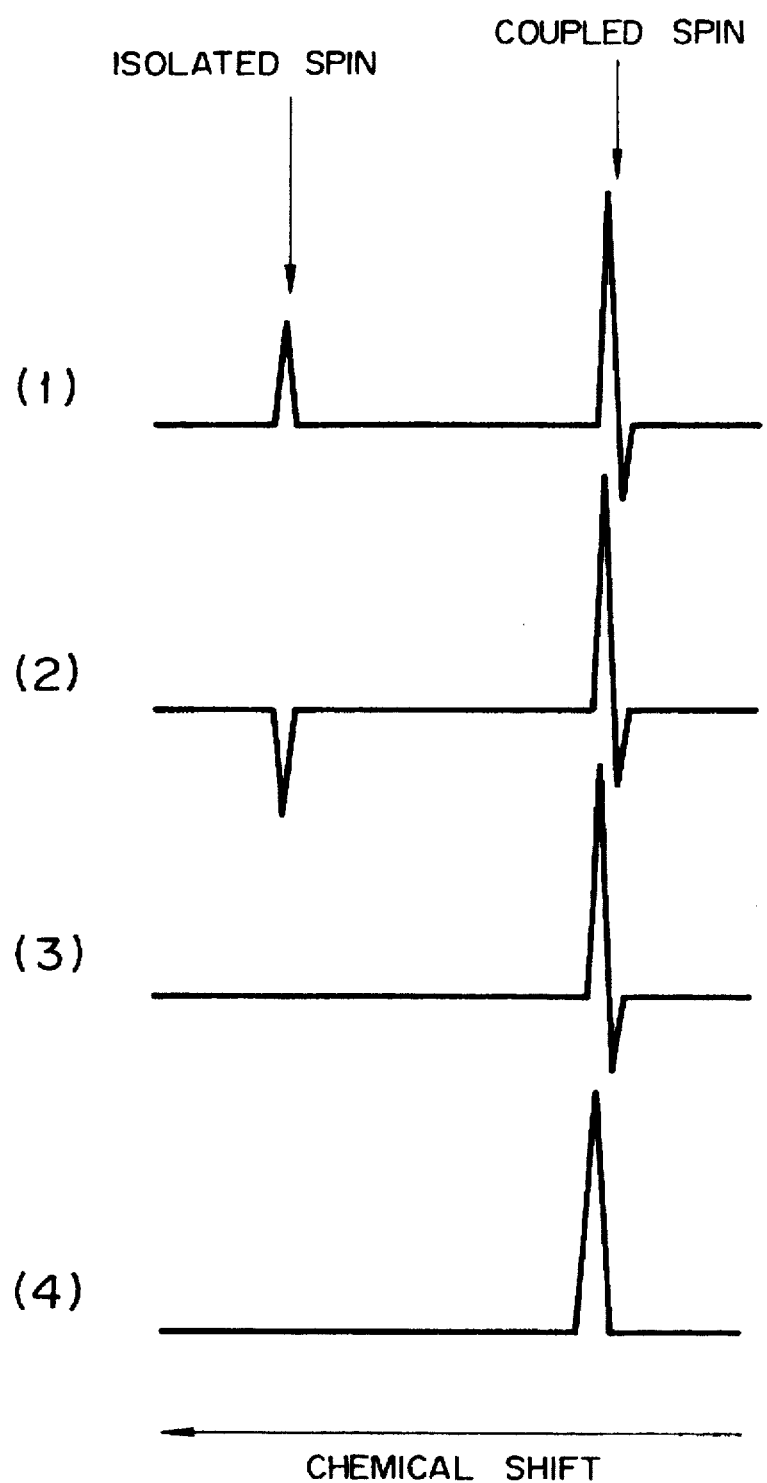
FIG. 8 is an illustration for showing cancelation of signals for an isolated spin by the use of a DEPT pulse train: (1) in FIG. 8 shows schematically a frequency spectrum of received signals obtained by the use of a predetermined pulse sequence in the first signal observation, (2) in FIG. 8 shows schematically a frequency spectrum of signals obtained with inversion of a third pulse phase for a nucleus to be irradiated and an receiver phase in the second signal observation, (3) in FIG. 8 shows schematically signals obtained by adding up the signals received in the first and second signal observations, and (4) in FIG. 8 shows the resulting absorption spectrum of a coupled spin.

With reference to FIG. 12, there is explained the case where a $^{31}$P nuclear magnetic resonance signal obtained through polarization transfer between $^{31}$P and $^{17}$O is observed using a one-dimensional HMQC pulse sequence. FIG. 12 shows a pulse sequence in which the evolution period 47 in the HMQC pulse sequence described in the reference and shown in FIG. 5 is changed to a fixed interval and only a detection period is dealt with as a time domain for Fourier transform. In the case of the pulse sequence shown in FIG. 12, a phase cycling of 180° step is carried out as in the case of the DEPT pulse sequence described in the reference.

In the first observation, the rf phases of the first pulse 29 and the second pulse 30 in a $^{31}$P channel are allowed to coinside with each other, and the rf phases of the first pulse 35 and the second pulse 36 in an $^{17}$O channel are allowed to coinside with each other. Signals for $^{31}$P are acquired in the detection period 34. In the second observation, the rf phase of the first pulse 35 or the second pulse 36 in the $^{17}$O channel is inverted 180° and the phase in the receiver 7 is inverted 180°, and signals for $^{31}$P are acquired in the detection period 34. The signals observed in the first and second observations are added up.

In the case of signals for $^{31}$P having no $^{17}$O bonded thereto, the phase of $^{31}$P resonance signals observed in the first observation and that in the second observation are inverted to each other because of the inversion of the phase in the receiver, so that the signals obtained in the first observation and those obtained in the second observation are canceled after the adding-up. But in the case of a signal for $^{31}$P having $^{17}$O bonded thereto, since the rf phase of a signal for $^{17}$O is inverted in the second observation, a $^{31}$P resonance signal obtained through polarization transfer is also inverted. In addition, the phase in the receiver is inversed. Therefore, the $^{31}$P resonance signal is observed at the same phase as in the first observation, so that the signal is accumulated by the adding-up of the signals observed in the first and second observations. Thus, the NMR signal for $^{31}$P having $^{17}$O bonded thereto is observed and the signals for $^{31}$P having no $^{17}$O bonded thereto can be canceled.

FIG. 13 and FIG. 14 show, as examples of measurement, $^{17}$O-$^{31}$P HMQC spectra obtained from 256 scans by using phosphoric acid labeled with $^{17}$O (25.7% by atom) as a sample. The $^{17}$O irradiation pulse width is 1 μs in FIG. 13 and 100 μs in FIG. 14. The HMQC spectrum intensity attained by the same times of accumulation varies depending on an observing apparatus. In the case of the observing apparatus used in the examples of measurement, the intensity is maximum when the $^{17}$O irradiation pulse width is 220 μs.

In FIG. 13, no spectrum is observed because the amount of magnetically excited $^{17}$O is smaller than in FIG. 14. In FIG. 14, a spectrum is observed. The spectrum which is observed in FIG. 14 but not in FIG. 13 is a $^{31}$P nuclear magnetic resonance signal spectrum obtained through polarization transfer between $^{31}$P and $^{17}$O in which the transient magnetic excitation of $^{17}$O is reflected in the $^{31}$P signal intensity. The fact that FIG. 13 involves no spectrum above noise level indicates that $^{31}$P nuclear magnetic resonance signals due to phosphoric acid not labeled with $^{17}$O are canceled by phase cycling.

Although a HMQC pulse train in which phase cycling of 180° is carried out is used in the examples shown in FIG. 13 and FIG. 14, the observation may be carried out using a DEPT pulse sequence.

FIG. 15 shows an example of sample tube for observing a mixed sample of $^{17}$O-labeled phosphoric acid and unlabeled pyrophosphoric acid. The sample tube is prepared by placing inorganic phosphoric acid and pyrophosphoric acid sealed up in a cappillary, in a glass tube 63 with an outside diameter of 5 mm and closing the glass tube with a fluorinated rubber cap 60. FIG. 16 and FIG. 17 show spectra obtained by observing the sample by the use of an $^{17}O$-$^{31}P$ HMQC pulse sequence.

FIG. 16 shows a spectrum which is obtained when in a HMQC pulse sequence, only the phase of $^{17}O$ second pulse is inverted and receiver phase is kept constant. FIG. 17 shows a spectrum obtained when phase cycling of 180° is carried out between the phase of $^{17}O$ second pulse and receiver phase. In FIG. 16, a spectrum of phosphoric acid is observed at a $^{31}P$ nuclear magnetic resonance signal chemical shift value of 0 ppm and a spectrum of pyrophosphoric acid at −13 ppm. In FIG. 17, only an inverted spectrum of phosphoric acid is observed and a spectrum of pyrophosphoric acid is canceled. In FIG. 17, the reason for the inversion of spectrum of phosphoric acid is that the sign of the enhancement factor in the equation 2 described in Description of the Related Art is negative.

With reference to FIG. 18 and FIG. 19, there is described below an example of application of the selective observation method of the present invention to the phosphoric acid metabolic system of an organism involving ATP synthesis. FIG. 18 is an illustration showing that $^{17}O$-labeled phosphoric acid 70 administered from the outside of cells, for example, by injection or by transportation in organisms, is incorporated into the cells to become intracellular phosphoric acid 71, which is attached to ADP 72 through a phosphoric acid metabolic pathway, resulting in synthesis of ATP 73. As schematically shown in FIG. 19, the extracellular phosphoric acid 70, the intracellular phosphoric acid 71 and the phosphoric acid group at the γ-position of ATP 73 can be spectroscopically distinguished from one another as a spectrum 80, a spectrum 81 and a spectrum 82, respectively, by the selective observation method of the present invention.

When a conventional method is employed, all of intracellular and extracellular phosphoric acid compounds are observed, so that there is obtained a spectrum 83 which does not particularly reflect the phosphoric acid metabolic process.

Similarly, with reference to FIG. 20 and FIG. 21, there is described below an example of application of the selective observation method of the present invention to the phosphoric acid metabolic system of an organism involving ATP decomposition. FIG. 20 is an illustration showing that $^{17}O$-labeled ATP 90 administered from the outside of cells, for example, by injection or by transportation in organisms, is incorporated into the cells to become intracellular ATP 91, which is decomposed into $^{17}O$-labeled phosphoric acid 92 and ADP 93 through a phosphoric acid metabolic pathway. As schematically shown in FIG. 21, the $^{17}O$-labeled phosphoric acid group at the γ-position of the extracellular ATP 90, the $^{17}O$-labeled phosphoric acid group at the γ-position of the intracellular ATP 91, and the $^{17}O$-labeled phosphoric acid 92 can be spectroscopically distinguished from one another as a spectrum 100, a spectrum 101 and a spectrum 102, respectively, by the selective observation method of the present invention.

When a conventional method is employed, all of intracellular and extracellular phosphoric acid compounds are observed, so that there is obtained a spectrum 103 which does not particularly reflect the phosphoric acid metabolic process.

The present invention can be applied to a method for measuring the phosphoric acid metabolism of an organism, by administering an $^{17}O$-labeled phosphoric acid compound such as $^{17}O$-labeled phosphoric acid to the phosphoric acid metabolic system of an organism, an organism tissue or a microorganism culture broth, observing a $^{31}P$ nuclear magnetic resonance signal made by the $^{17}O$-labeled phosphoric acid compound, and following the change of the signal intensity with time. Furthermore, since the change of the signal intensity with time reflects the state of phosphoric acid metabolism by cells, proliferation and metabolism of the cells can be estimated. Therefore, it becomes possible to control cultivation conditions for microorganism cells, animal cells, plant cells, etc. efficiently by controlling the amounts of nutrients, oxygen, etc. supplied to a culture broth on the basis of the change of the signal strength with time.

As a specific example of such application, there is explained below an example in which the present invention is applied to the detection of a $^{31}P$ nuclear magnetic resonance (NMR) signal from adenosine diphosphate (ADP). In this example, the progress of a bio-chemical hydrolytic reaction of ATP is observed without contact and invasion by following the amount of ADP in a mixture of phosphoric acid compounds. For this purpose, in an apparatus for detecting $^{31}P$-NMR of ADP, $^{31}P$ bonded to $^{17}O$ is measured, namely, a $^{31}P$-NMR signal obtained through polarization transfer between $^{17}O$ and $^{31}P$ is observed. By phase cycling of $^{17}O$ irradiation pulse and $^{31}P$ receiver phase, a $^{31}P$-NMR signal for $^{31}P$ having spin-spin coupling with $^{17}O$ is observed and $^{31}P$-NMR signals for $^{31}P$ having no spin-spin coupling with $^{17}O$ are canceled.

As represented by the chemical structural formula shown in FIG. 22, ADP has two phosphoric acid groups in the molecule, and the positions of the phosphorus atoms are distinguished from each other by naming them as follows: the position of phosphorus atom of the phosphoric acid attached to adenosine is named α-position and the position of the phosphorus atom at the end is named β-position. In FIG. 22, numeral 120 shows an adenyl group, numeral 121 the phosphorus atom at the α-position of ADP, and numeral 122 the phosphorus atom at the β-position of ADP. Similarly, as represented by the chemical structural formula showin in FIG. 23, adenosine triphosphate (ATP) has three phosphoric acid groups in the molecule, and as in ADP, the positions of the phosphorus atoms are distinguished from one another by naming them α-position, β-position and γ-position, respectively, starting from the position next to the adenosine. In FIG. 23, numeral 123 shows an adenyl group, numeral 124 the phosphorus atom at the α-position of ATP, numeral 125 the phosphorus atom at the β-position of ATP, and numeral 126 the phosphorus atom at the γ-position of ATP. In $^{31}P$-NMR spectrum of ADP and ATP, $^{31}P$ at the β-position of ADP and $^{31}P$ at the γ-position of ATP are observed at a chemical shift value of about −6 ppm; $^{31}P$ at the α-position of ADP and $^{31}P$ at the α-position of ATP are observed at a chemical shift value of about −11 ppm; and $^{31}P$ at the β-position of ATP is observed at a chemical shift value of about −19 ppm. FIG. 24 shows ADP labeled with $^{17}O$ at the hydroxyl oxygen atom, and numeral 127 shows the $^{17}O$ of the ADP labeled with $^{17}O$ at the hydroxyl oxygen atom bonded to the phosphorus atom at the β-position. FIG. 25 shows ADP labeled with $^{17}O$ at the oxygen atom bonded to both of the phosphorus atoms at the α-position and the β-position, and numeral 28 shows the label $^{17}O$.

FIG. 26 is a schematic diagram showing that ADP is produced from ATP by the progress of hydrolytic reaction by an enzyme having an ATP-hydrolytic function. ATP 150 in an aqueous solution becomes ATP 151 attached to the active center of the enzyme 155, and ATP 151 is hydrolyzed into ADP 152 and inorganic phosphoric acid 153. As the enzyme 155, any enzyme may be used so long as it has an ATP-hydrolytic function. Whether the enzyme 155 is active in an aqueous solution or active in a lipid membrane does not matter much. FIG. 27 is a schematic diagram of selective $^{31}$P-NMR spectra obtained when the process of the hydrolysis is observed with the lapse of time. With the lapse of time, ATP labeled with $^{17}$O at the β-position and observed as a peak 160 decreases, and ADP labeled with $^{17}$O at the β-position and observed as a peak 161 increases. As a sample to be measured in the spectra obtained with the lapse of time, any sample may be used so long as it contains an enzyme having an ATP-hydrolytic function. There may be used aqueous enzyme solutions, cell extracts, cultured cells, microorganism cultures, removed tissues, organisms, etc.

In addition to ADP and ATP, phosphoric acid compounds such as nicotinamide adenine dinucleotide (NAD) shown in FIG. 28 and nicotinamide adenine dinucleotide phosphate (NADP) shown in FIG. 29 exist in organisms. It is known that $^{31}$P-NMR spectra of NAD and NADP overlap with $^{31}$P-NMR spectra of the phosphoric acid group at the α-position of ATP and the phosphoric acid group at the α-position of ADP. According to the present example, the change of the hydrolysis process with time can be observed by removing non-objective spectrum as explained in FIG. 27.

FIG. 30 is an illustration showing an example of magnetic resonance spectral imaging apparatus obtained by adding gradient magnetic field coils 260 and 261 to the $^{31}$P nuclear magnetic resonance signal detector for adenosine diphosphate shown in FIG. 11 and thereby addding a function of giving chemical shift imaging. The difference between the imaging apparatus and the NMR apparatus is that the imaging apparatus is given the following function: a gradient magnetic field is applied to a sample in synchronism with an observation pulse train and NMR spectrum in a specific space is observed. The imaging apparatus's mechanism for selective observation of a $^{31}$P-NMR signal obtained through polarization transfer between $^{17}$O and $^{31}$P is the same as that of the NMR apparatus. When an aqueous enzyme solution, a cell extract, cultured cells, a microorganism culture, a removed tissue, an organism or the like, which is present in a specific space, is observed by means of the magnetic resonance spectral imaging apparatus of the present example, ADP labeled with $^{17}$O at the β-position produced by hydrolysis of ATP labeled with $^{17}$O at the β-position can be detected as an NMR spectrum having a chemical shift value of about −6 ppm even when a plurality of phosphoric acid compounds are present as a mixture in the sample to be observed. It is sufficient that said magnetic resonance spectral imaging apparatus and detector has a mechanism capable of exciting $^{17}$O and $^{31}$P in a measuring space at the same time. Whether the imaging apparatus and detector has a mechanism for exciting a nuclear species other than the above two nuclear species does not matter much. Any type of gradient magnetic field coils may be used as the gradient magnetic field coils 260 and 261. The imaging apparatus and detector may have a mechanism for correction for magnetostriction caused by an eddy current at the time of generation of a gradient magnetic field.

Next, there are explained below an example of nuclear magnetic resonance probe comprising a single coil as a nuclear magnetic resonance (NMR) probe involving magnetic resonance imaging (MRI) and magnetic resonance spectral imaging (MRS), and circuits for supplying a plurality of electric currents different in frequency; and an example of nuclear magnetic resonance apparatus using the nuclear magnetic resonance probe.

FIG. 31 is an illustration of the double resonance circuit of the nuclear magnetic resonance probe of the present example. The sample-holding tube 323 exemplified in FIG. 15 is set inside the detecting coil 307. An rf with a frequency $f_1$ is applied to a terminal 301 and an rf with a frequency $f_2$ to a terminal 313. A phase shifter 308, an inductor 309 and a variable capacitor 310 constitute an rf trap in which the attenuation of passing characteristics become maximum at the frequency $f_1$. A phase shifter 306, an inductor 304 and a variable capacity 305 constitute an rf trap in which the attenuation of passing characteristics become maximum at the frequency $f_2$. Each of numerals 302, 303, 311 and 312 shows a variable capacitor. At the frequency $f_1$, the series resonator composed of the inductor 304 and the variable capacitor 305 of the probe circuit is in a high-impedance state, and the trap composed of the phase shifter 308, the inductor 309 and the variable capacitor 310 produces standing waves to keep the point A at a high voltage and hence can be considered to be equivalent to the circuit shown in FIG. 32. At the frequency $f_2$, the series resonator composed of the inductor 309 and the variable capacitor 310 of the probe circuit is in a high-impedance state, and the trap composed of the phase shifter 306, the inductor 304 and the variable capacitor 305 produces standing waves to keep the point A at a high voltage and hence can be considered to be equivalent to the circuit shown in FIG. 33. That is, by the incorporation of the two rf traps, the point A at one end of the detecting coil is kept at a high voltage at the two specific frequencies, so that a double resonance circuit is obtained.

Needless to say, a triple resonance circuit can be made up by connecting to the detecting coil a circuit which resonates at a third frequency, or setting a coil for irradiation with a third frequency in the vicinity of the detecting coil. In addition, it is of course possible to make up a quadruple resonance circuit by overlap of spaces for two of the double resonance circuits inside the detecting coil.

In the case of nuclear magnetic resonance probe circuit of the present example, a double resonance circuit can be made up even when one of the rf traps is omitted. FIG. 34 shows an example of such a double resonance circuit. As described above in detail, a high frequency with the frequency $f_1$ applied to an terminal 301 does not reach a terminal 313 because of the production of standing waves by an rf trap composed of a phase shifter 308, an inductor 309 and a variable capacitor 310. An rf with the frequency $f_2$ applied to a terminal 313 leaks out to reach the terminal 301 because of the absence of a corresponding rf trap, so that the irradiation efficiency is lower than that attained in the presence of the trap. However, as for a steady-state resonance such as deuterium for internal lock, shortage of the signal sensitivity can be recovered by increasing irradiation power. Therefore, the omission of one of the traps permits provision of a circuit having a reduced number of parts and a reduced number of portions to be adjusted. That is, when a quadruple resonance circuit capable of applying four different rf frequencies respectively to one and the same sample is made up using two double resonance circuits, improvement of the reliability can be expected by reducing the number of parts and that of portions to be adjusted.

Another example of an rf trap is described below with reference to FIG. 35, FIG. 36, FIG. 37, FIG. 38 and FIG. 39. As in the above explanation with FIG. 31, a phase shifter 308 can be made of, for example, a coaxial cable with a length of odd-numbered times as large as quarter-wave length. The following is also possible: as shown in FIG. 38 and FIG. 39, a transmission line made of, for example, a coaxial cable with a length smaller than odd-numbered times as large as quarter-wave length and a variable inductor 316 are connected in series, and the total phase delay in the transmission line and the inductor is adjusted to 90°. A fixed inductor may be used in place of the variable inductor 316.

The combination of the phase shifter and a resonator in the rf trap may be carried out by connecting wirings electrically as shown in FIG. 35, or forming a capacitor constituting the resonator, in the shape of a feedthrough condenser around the transmission line of the phase shifter, as shown in FIG. 36. Alternatively, as shown in FIG. 37, the primary winding of an rf transformer 317 may be connected to the phase shifter to connect the phase shifter magnetically to the resonator connected to a secondary winding.

In the present example, since the position of attaching the resonator can be isolated from the space between the magnetic poles, a cored rf transformer having a quality factor higher than that of an air-core transformer, such as a ferrite-cored toroidal-type transformer can be used as the rf transformer.

When a coaxial cable or a semirigid cable is used as the transmission line of the phase shifter, outer conductors are grounded as follows: as shown in FIG. 31, a part of each of the outer conductors of the phase shifter 306 and the phase shifter 308 may be grounded; or as shown in FIG. 40, the outer conductors may be connected to a detecting coil 307, a variable condenser 305 and a variable condenser 310.

The double resonance circuit shown in FIG. 31 can be incorporated with the above-mentioned high-frequency trap.

When impedance irregularities occur in the detecting coil 307 owing to the employment of a transmission line with a constant characteristic impedance (e.g. a coaxial cable or a semirigid cable) as the phase shifter, the impedance irregularities can be reduced by connecting, as shown in FIG. 41, a condenser 314 in parallel to the detecting coil 307.

FIG. 42 shows an example of quadruple resonance circuit using the double resonance circuits of the present example. The double resonance circuit to which a detecting coil 307, a terminal 301 and a terminal 313 are connected is the double resonance circuit having two traps explained with FIG. 31, and the double resonance circuit to which an irradiating coil 307', a terminal 301' and a terminal 313' are connected is the double resonance circuit having a trap explained with FIG. 34. In the quadruple resonance circuit of the present invention, there may be used either a pair of the double resonance circuits shown in FIG. 31 or a pair of the double resonance circuits shown in FIG. 34.

As the shapes of the detecting coil 307 and the irradiating coil 307', any shapes may be employed. In the quadruple resonance circuit, coils different in shape may be combined as follows: a coil of solenoid shape is used as the detecting coil 307 and a coil of saddle shape as the irradiating coil 307'.

In FIG. 31, as the phase shifter 308, any phase shifter may be used so long as a phase delay of odd-numbered times as large as 90° takes place at its cutoff frequency. The phase shifter 308 can be made of, for example, a coaxial cable with a length of odd-numbered times as long as the quarter-wave length of an rf with a frequency f. A semirigid cable, a microstrip line or a helical transmission line may also be used for making the phase shifter 308. When hydrogen with a resonance frequency of 100 MHz is observed using magnets with a magnetic flux density of 2.35 T and a semirigid cable with a compression coefficient (i.e. a ratio of the wave length of an electromagnetic wave in a conductor to that measured in vacuo) of 0.69, a length of the cable corresponding to quarter-wave length is 518 mm which makes it possible to assure a transmission line length sufficient to isolate a tuning and matching circuit from a detecting circuit inserted between the magnetic poles of a high-resolution NMR apparatus.

Similarly, when hydrogen with a resonance frequency of 300 MHz is resonated by means of a nuclear magnetic resonator equipped with superconducting magnets with a magnetic flux density of 7.0 T, a distance sufficient to isolate a tuning and matching circuit from a detecting circuit inserted between the magnetic poles of a high-resolution NMR apparatus can be assured by adjusting the cable length to a length of three times as large as quarter-wave length, i.e., 518 mm, in view of the fact that the length of wiring from detecting coil to terminal of an ordinary high-resolution nuclear magnetic resonance probe equipped with superconducting magnets is about 360 mm. When $^{13}C$ with a resonance frequency of 75 MHz is resonated by means of the same resonator as above, the length of the phase shifter may be 690 mm which is quarter-wave length.

When a coaxial cable or a semirigid cable is used as the transmission line of the phase shifter, quarter-wave length is too long in some cases as compared with the distance between the detecting circuit and the tuning and matching circuit, depending on a frequency used. As shown in FIG. 38 and FIG. 39 for illustration, the problem of the excessive length of the cable can be solved by connecting a transmission line made of a coaxial cable or the like to an inductor in a series to make up a phase shifter having a total phase delay in the transmission line and the inductor of odd-numbered times as large as 90°.

In the present example, because of the isolation of the detecting coil and the tuning and matching circuit from each other, the following, for example, can be exemplified as an energy transfer system which undergoes physical or chemical interaction with a sample to be measured and can be set in a space formerly occupied by the tuning and matching circuit: microwave transmission lines for heating a sample solution such as water momentarily; optical fibers for transferring exciting light to a sample capable of undergoing photochemical reaction; and systems for transferring a stress to a sample which undergoes elastic deformation to change in mechanical resonance characteristics. Furthermore, since the rf trap of the nuclear magnetic resonance probe includes the series resonator and shows a smaller attenuation at passing frequency than that in a trap including a parallel resonator, frequency separation in the measurement of nuclear species similar to one another in frequency can be improved and moreover the lowering of the irradiation efficiency and the detection sensitivity can be prevented.

In the probe obtained by incorporating the rf trap(s) into a part of the probe circuit and connecting the same to the detecting coil, the number of electric contacts is smaller than in a probe having a trap attached as another box to the outside thereof through a terminal. Therefore, the former probe is advantageous in that since the transmission loss of detected signals is reduced, the improvement of the detection sensitivity can be expected, and that since the transmission loss in rf irradiation of a sample is reduced, the improvement of the irradiation efficiency can be expected.

In the present example, the tuning and matching circuit can be isolated from the space between the magnetic poles because a coaxial cable is used as the phase shifter. Therefore, magnets with a narrower space between magnetic poles can be utilized, it becomes possible to minuaturize magnets having the same magnetic flux density, and it becomes possible to utilize magnets having a higher magnetic flux density without increase of their outside dimensions. Furthermore, in the nuclear magnetic resonance probe, since structures other than the detecting coil can be isolated from the space between the magnetic poles, the variable capacitors used for tuning and matching and the inductors used in the traps may contain a magnetic material.

We claim:

1. A method for measuring nuclear magnetic resonance comprising labeling a phosphoric acid group contained in a sample with at least $^{17}O$, one atom and detecting a nuclear magnetic resonance signal due to the labeled phosphoric acid group in distinction from nuclear magnetic resonance signals due to unlabeled phosphoric acid groups by utilizing polarization transfer attributable to a spin-spin coupling between $^{31}P$ and $^{17}O$.

2. A method according to claim 1, wherein said labeling is conducted by introducing an $^{17}O$-labeled phosphoric acid compound into an organism tissue by transportation in an organism.

3. A method according to claim 1, wherein a reagent containing an $^{17}O$-labeled phosphoric acid group is introduced from the outside of the organism by injection.

4. A method according to claim 1, wherein said at least one $^{17}O$ atom is chemically bonded to $^{31}P$ so as to provide spin-spin coupling between said at least one $^{17}O$ and the $^{31}P$, whereby a nuclear magnetic resonance spectrum of the $^{31}P$ is split and a line width of the nuclear magnetic resonance spectrum is enlarged as compared to an unlabeled phosphoric acid compound.

5. A method for selective observation of a nuclear magnetic resonance signal which comprises using as a sample for measurement a material containing an $^{17}O$-labeled phosphoric acid compound containing at least one $^{17}O$ atom in the phosphoric acid group at a rate higher than the natural isotopic abundance of $^{17}O$ and a phosphoric acid compound containing $^{17}O$ present at the natural isotopic abundance, eliminating $^{31}P$ nuclear magnetic resonance signals made by the $^{17}O$-unlabeled phosphoric acid compound by using a pulse sequence which permits observation of a $^{31}P$ nuclear magnetic resonance signal obtained through polarization transfer attributable to spin-spin coupling between $^{17}O$ and $^{31}P$, and observing a $^{31}P$ nuclear magnetic resonance signal made by the $^{17}O$-labeled phosphoric acid compound.

6. A method for measuring phosphoric acid metabolism of an organism by a method for selective observation of a $^{31}P$ nuclear magnetic resonance signal according to claim 5, which comprises administering an $^{17}O$-labeled phosphoric acid compound to an organism capable of metabolizing phosphoric acid with the lapse of time, and observing a $^{31}P$ nuclear magnetic resonance signal due to the labeled phosphoric acid group.

7. A method for controlling cell culture which comprises calculating a metabolism rate in microorganism cells, animal cells or plant cells from an amount of an $^{17}O$-labeled phosphoric acid compound consumed in a definite time, by a method for measuring phosphoric acid metabolism according to claim 6, and controlling a supply rate of nutrients to be supplied to the cells based on said metabolism rate.

8. A method for imaging phosphoric acid metabolism of an organism by a method for measuring phosphoric acid metabolism according to claim 6, which comprises observing a $^{31}P$ nuclear magnetic resonance signal due to an $^{17}O$-labeled phosphoric acid group by a magnetic resonance imaging method or a magnetic resonance spectral method.

9. A method for measuring phosphoric acid metabolism of an organism by a method for selective observation of a $^{31}P$ nuclear magnetic resonance signal according to claim 5, wherein said at least one $^{17}O$ atom is chemically bonded to $^{31}P$ so as to provide spin-spin coupling between said at least one $^{17}O$ and the $^{31}P$, whereby a nuclear magnetic resonance spectrum of the $^{31}P$ is split and a line width of the nuclear magnetic resonance spectrum is enlarged as compared to an unlabeled phosphoric acid compound.

10. An apparatus for selective observation of a $^{31}P$ nuclear magnetic resonance signal which comprises a container to accommodate a sample for measurement containing an $^{17}O$-labeled phosphoric acid compound having at least one $^{17}O$ atom in its phosphoric acid group at a rate higher than the natural isotopic abundance of $^{17}O$ and a phosphoric acid compound containing $^{17}O$ present at the natural isotopic abundance, an irradiating coil for exciting $^{17}O$ magnetically by a predetermined pulse sequence, an irradiating coil and detecting coil for exciting and observing $^{31}P$ magnetically by a predetermined pulse sequence, at least two transmitters for applying voltages of predetermined frequencies to each of the irradiating coils for $^{17}O$ and $^{31}P$, a receiver in which nuclear magnetic resonance signals from the sample through the observing coil are detected, and the detected nuclear magnetic resonance signals are subjected to a predetermined processing, followed by observing a $^{31}P$ nuclear magnetic resonance signal from the $^{17}O$-labeled phosphoric acid compound, and a means for applying a predetermined magnetic field to the sample and the coils.

11. An apparatus for detecting a $^{31}P$ nuclear magnetic resonance signal from adenosine diphosphate according to claim 10, wherein the frequency of a transmitter of $^{31}P$ channel is adjusted to observe β-$^{17}O$-labeled adenosine diphosphate having at least one $^{17}O$ atom bonded to the phosphorus atom at its β-position.

12. An apparatus for selective detection of a $^{31}P$ nuclear magnetic resonance signal from adenosine diphosphate according to claim 11, wherein the frequency of the transmitter of $^{31}P$ channel is adjusted to observe β-$^{17}O$-labeled adenosine containing a plurality of phosphoric acid compounds as a mixture thereof.

13. An apparatus for selective $^{31}P$ nuclear magnetic resonance spectral imaging of 8-$^{17}O$-labeled adenosine diphosphate having at least one $^{17}O$ atom bonded to the phosphorus atom at its β-position, comprising a mechanism capable of producing a gradient magnetic field and an apparatus for selective detection of a $^{31}P$ nuclear magnetic resonance signal from adenosine diphosphate according to claim 12.

14. An apparatus for selective $^{31}P$ nuclear magnetic resonance spectral imaging of β-$^{17}O$-labeled adenosine diphosphate having at least one $^{17}O$ atom bonded to the phosphorus atom at its β-position, comprising a mechanism capable of producing a gradient magnetic field, and an apparatus for selective detection of a $^{31}P$ nuclear magnetic resonance signal from adenosine diphosphate according to claim 11.

15. An apparatus for selective observation of a $^{31}$P nuclear magnetic resonance signal according to claim 10, wherein said $^{17}$O-labeled phosphoric acid compound has said at least one $^{17}$O atom chemically bonded to $^{31}$P so as to provide spin-spin coupling between said at least one $^{17}$O and the $^{31}$P, whereby a nuclear magnetic resonance spectrum of the $^{31}$P is split and a line width of the nuclear magnetic resonance spectrum is enlarged as compared to an unlabeled phosphoric acid compound.

* * * * *

UNITED STATES PATENT AND TRADEMARK OFFICE
CERTIFICATE OF CORRECTION

PATENT NO. : 5,707,875
DATED : January 13, 1998
INVENTOR(S) : TAMURA, et al.

It is certified that error appears in the above-identified patent and that said Letters Patent is hereby corrected as shown below:

On the title page, item [54] and Column 1, line 1.

delete "170-LABELED" and insert -- $^{17}$O-LABELED--.

Column 20, line 53 (line 2 of claim 13), delete "8-$^{17}$O-labeled" and insert --β-$^{17}$O-labeled--.

Signed and Sealed this

Eighteenth Day of August, 1998

Attest:

BRUCE LEHMAN

Attesting Officer

Commissioner of Patents and Trademarks